(12) United States Patent
Yuu

(10) Patent No.: US 11,073,654 B2
(45) Date of Patent: Jul. 27, 2021

(54) LIGHT EMITTING MODULE WITH RECESSES IN LIGHT GUIDE PLATE

(71) Applicant: NICHIA CORPORATION, Anan (JP)

(72) Inventor: Hiroki Yuu, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/728,346

(22) Filed: Dec. 27, 2019

(65) Prior Publication Data
US 2020/0209458 A1   Jul. 2, 2020

(30) Foreign Application Priority Data

Dec. 28, 2018  (JP) .............................. JP2018-246836
Nov. 18, 2019  (JP) .............................. JP2019-207695

(51) Int. Cl.
*F21V 8/00* (2006.01)
*H01L 33/50* (2010.01)
(Continued)

(52) U.S. Cl.
CPC ........... *G02B 6/009* (2013.01); *G02B 6/0021* (2013.01); *G02B 6/0036* (2013.01);
(Continued)

(58) Field of Classification Search
CPC .... G02B 6/009; G02B 6/0021; G02B 6/0036; G02B 6/0055; G02B 6/0065
See application file for complete search history.

(56) References Cited

U.S. PATENT DOCUMENTS

2007/0147073 A1   6/2007  Sakai et al.
2008/0055931 A1 * 3/2008  Verstraete ............ G02B 6/0068
                                                                362/612
(Continued)

FOREIGN PATENT DOCUMENTS

JP   2007018936 A   1/2007
JP   2007048489 A   2/2007
(Continued)

*Primary Examiner* — Rajarshi Chakraborty
*Assistant Examiner* — Michael Chiang
(74) *Attorney, Agent, or Firm* — Hunton Andrews Kurth LLP

(57) ABSTRACT

Provided is a light emitting module, including: a light guide plate having a first main surface and a second main surface opposite to the first main surface; a plurality of light source members disposed on a second main surface side, each of the light source members including a light emitting element having a main light emitting surface, an electrode formation surface located opposite to the main light emitting surface, and a side surface between the main light emitting surface and the electrode formation surface, and a wavelength conversion member covering the main light emitting surface and the side surface of the light emitting element; and a sealing member covering the plurality of light source members and the second main surface of the light guide plate. The light guide plate has a plurality of first recesses located at the second main surface, and each of the plurality of light source members is disposed such that at least a part of the side surface of the light emitting element is located in the first recess in a cross-sectional view.

13 Claims, 15 Drawing Sheets

(51) Int. Cl.
*H01L 33/54* (2010.01)
*H01L 33/62* (2010.01)
*H01L 33/60* (2010.01)

(52) U.S. Cl.
CPC ......... *G02B 6/0055* (2013.01); *G02B 6/0065* (2013.01); *G02B 6/0068* (2013.01); *G02B 6/0073* (2013.01); *H01L 33/505* (2013.01); *H01L 33/54* (2013.01); *H01L 33/60* (2013.01); *H01L 33/62* (2013.01); *H01L 2933/005* (2013.01)

(56) References Cited

U.S. PATENT DOCUMENTS

| | | | |
|---|---|---|---|
| 2009/0086508 A1* | 4/2009 | Bierhuizen | G02B 6/0021 362/617 |
| 2010/0220484 A1* | 9/2010 | Shani | G02B 6/009 362/296.09 |
| 2011/0090672 A1* | 4/2011 | Zhu | G02B 6/0021 362/97.1 |
| 2011/0149594 A1* | 6/2011 | Terajima | G02B 6/0021 362/606 |
| 2011/0164402 A1 | 7/2011 | Kang et al. | |
| 2011/0194034 A1* | 8/2011 | Shimizu | G02B 6/0078 348/739 |
| 2012/0069575 A1* | 3/2012 | Koh | G02B 6/0036 362/296.01 |
| 2012/0307519 A1 | 12/2012 | Sakai | |
| 2014/0362573 A1 | 12/2014 | Imai et al. | |
| 2015/0036317 A1 | 2/2015 | Yamamoto et al. | |
| 2017/0054062 A1* | 2/2017 | Tamaki | H01L 33/507 |
| 2017/0261161 A1* | 9/2017 | Moon | F21V 3/02 |
| 2018/0108815 A1 | 4/2018 | Hayashi | |
| 2018/0239193 A1 | 8/2018 | Hayashi | |
| 2018/0335559 A1* | 11/2018 | Cho | G02B 6/0016 |
| 2019/0310519 A1 | 10/2019 | Yamamoto et al. | |
| 2019/0324184 A1* | 10/2019 | Cai | G02B 6/0021 |

FOREIGN PATENT DOCUMENTS

| | | |
|---|---|---|
| JP | 2007188863 A | 7/2007 |
| JP | 2007207572 A | 8/2007 |
| JP | 2008059786 A | 3/2008 |
| JP | 2010008837 A | 1/2010 |
| JP | 2010157464 A | 7/2010 |
| JP | 2011039122 A | 2/2011 |
| JP | 2011108367 A | 6/2011 |
| JP | 2011142079 A | 7/2011 |
| JP | 2011210674 A | 10/2011 |
| JP | 2012146942 A | 8/2012 |
| JP | 2015032373 A | 2/2015 |
| JP | 2018067630 A | 4/2018 |
| JP | 2018101521 A | 6/2018 |
| JP | 2018133304 A | 8/2018 |
| WO | 2011135627 A1 | 11/2011 |
| WO | 2013042662 A1 | 3/2013 |

* cited by examiner

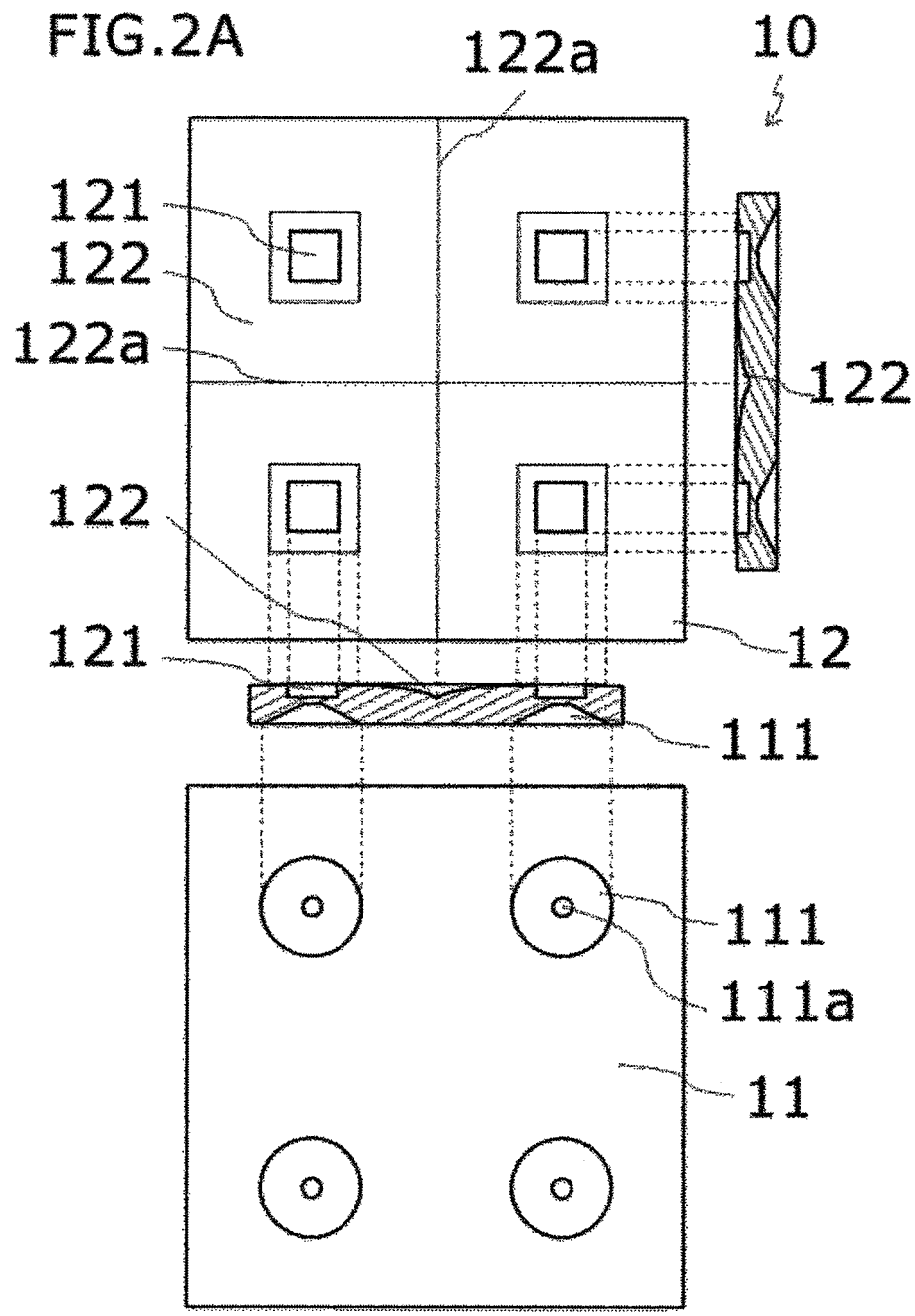

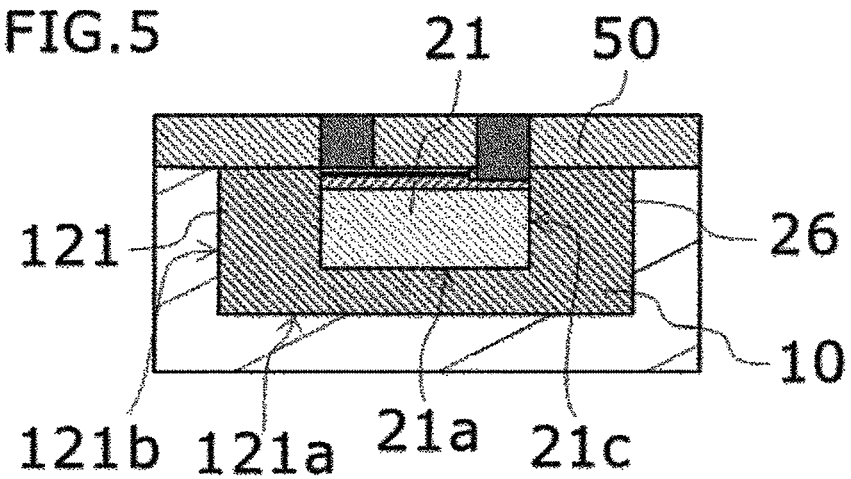
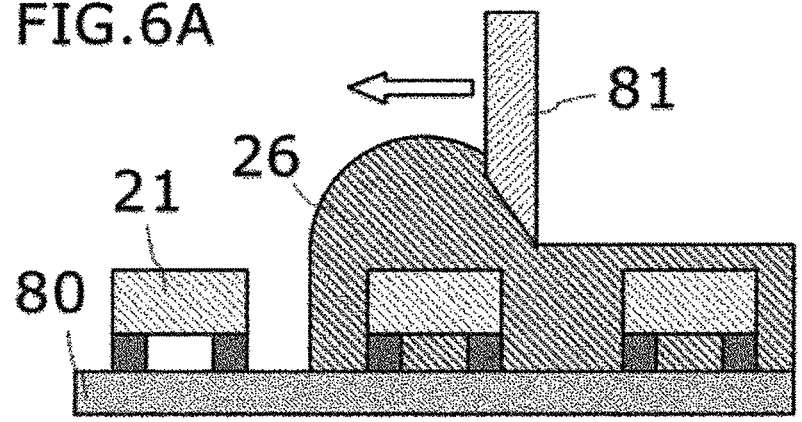
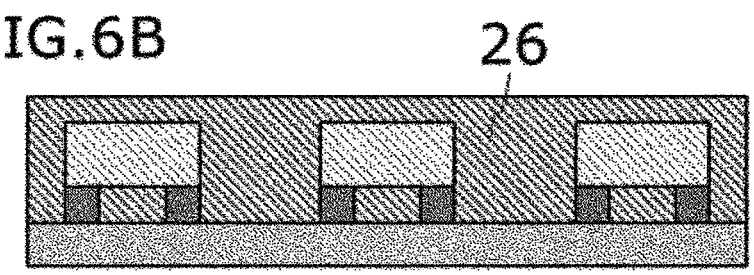

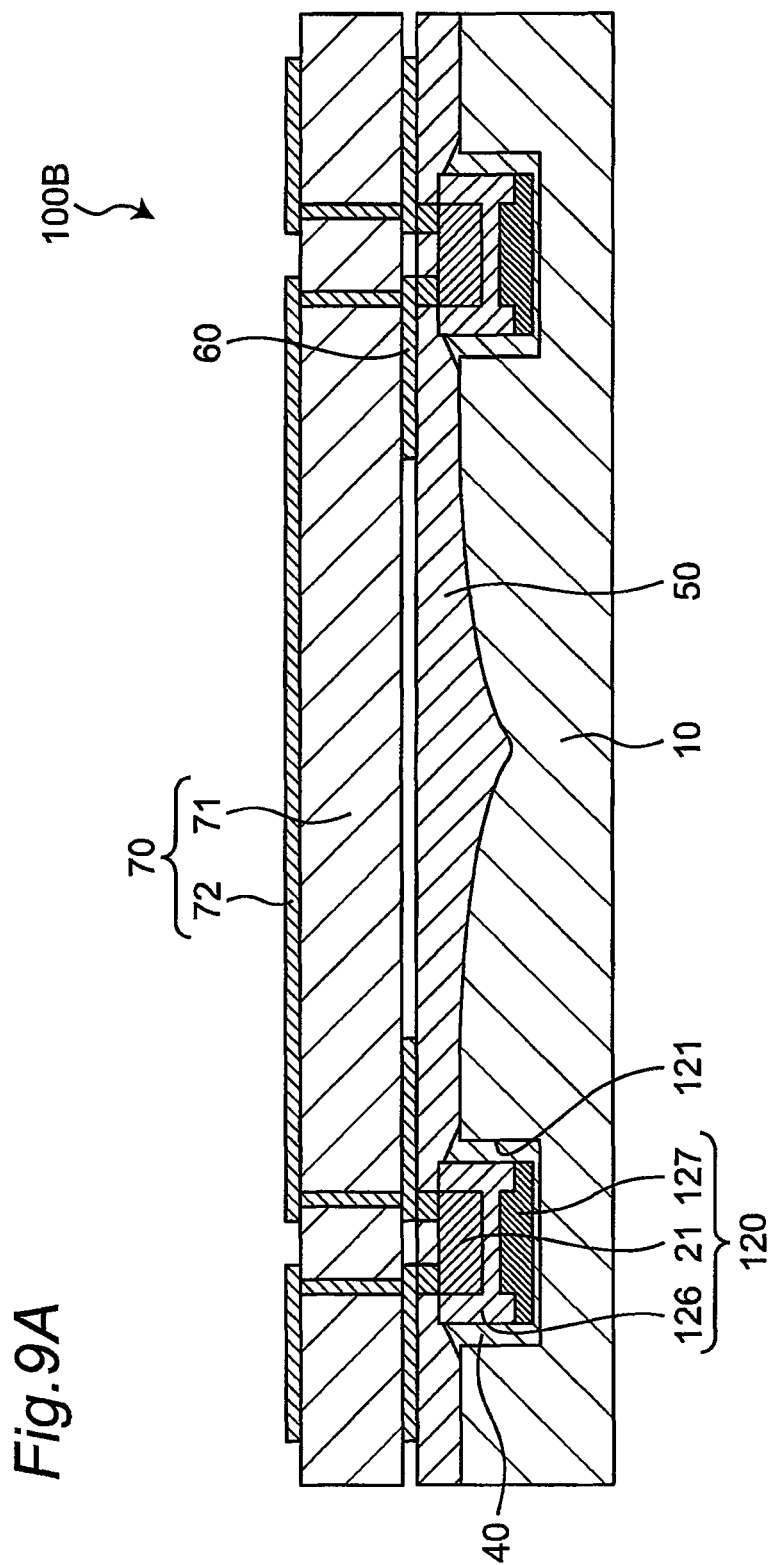

LIGHT EMITTING MODULE WITH RECESSES IN LIGHT GUIDE PLATE

CROSS-REFERENCE TO RELATED APPLICATIONS

This application claims priority to Japanese Patent Application No. 2018-246836, filed on Dec. 28, 2018, and Japanese Patent Application No. 2019-207695, filed on Nov. 18, 2019. The contents of these applications are hereby incorporated by reference in their entirety.

BACKGROUND

Field

The present disclosure relates to a light emitting module.

Related Art

Light emitting devices using light emitting elements, such as light emitting diodes, are widely used as various light sources of displays, such as backlights of liquid crystal displays.

For example, a light source device disclosed in JP 2015-32373 A includes: a plurality of light emitting elements mounted on a mounting substrate; hemispherical lens members that respectively seal the plurality of light emitting elements; and a diffusion member disposed thereover and on which light from the light emitting elements is incident.

However, in the light source device, such as that mentioned in JP 2015-32373 A, the distance between the mounting substrate and a diffusion plate needs to be larger than the thickness of the lens member, which may make it difficult to achieve adequate thinning of the light source device.

SUMMARY

Therefore, an aspect of the present disclosure provides a light emitting module that includes a light guide plate and a light emitting element and can be thinned.

A light emitting module according to the present disclosure has the following configuration.

The light emitting module includes: a light guide plate having a first main surface and a second main surface opposite to the first main surface; a plurality of light source members disposed on a side of the second main surface, each of the plurality of light source members including a light emitting element that has a main light emitting surface, an electrode formation surface located opposite to the main light emitting surface, and a side surface between the main light emitting surface and the electrode formation surface, and a wavelength conversion member covering the main light emitting surface and the side surface of the light emitting element; and a sealing member covering the plurality of light source members and the second main surface of the light guide plate, wherein the light guide plate has a plurality of first recesses located at the second main surface, and each of the plurality of light source members is disposed such that at least a part of the side surface of the light emitting element is located in the corresponding one of the plurality of first recess in a cross-sectional view.

Therefore, the light emitting module that includes the light guide plate and the light emitting element and can be thinned is provided.

BRIEF DESCRIPTION OF THE DRAWINGS

FIG. 2A shows a partially enlarged schematic plan view and a partially enlarged schematic side view of an example of a light guide plate according to the first embodiment.

FIG. 5 is a schematic cross-sectional view showing an example of the light source member in the light emitting module according to the first embodiment.

FIG. 6A is a partially enlarged schematic cross-sectional view showing an example of a manufacturing step of the light source member.

FIG. 6B is a partially enlarged schematic cross-sectional view showing an example of another manufacturing step of the light source member.

FIG. 9A is a partially enlarged schematic cross-sectional view of a light emitting module according to a second embodiment.

DETAILED DESCRIPTION

Figure 1A:
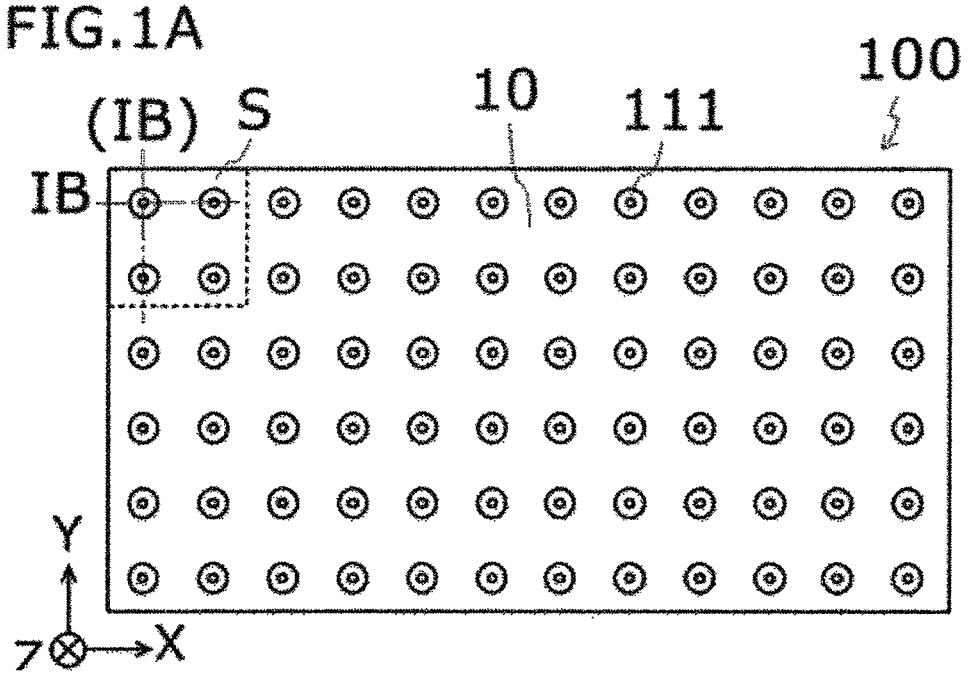
FIG. 1A is a schematic plan view showing an example of a light emitting module according to a first embodiment of the present disclosure.

The present invention will be described in detail below with reference to the accompanying drawings. In the description below, the terms (e.g., "upper", "lower" and other words, including these words) indicative of specific directions or positions are used as needed. These terms are used for ease of understanding of the present invention with reference to the drawings, and do not limit the technical range of the present invention by their meanings. The same or equivalent parts or members are designated by the same reference numerals throughout the drawings. Each member is denoted by the same reference character, for example, even when its state, shape, or the like changes before and after curing or cutting.

Embodiments mentioned below are to exemplify light emitting modules for embodying the technical idea of the present invention, but not to limit the present invention to the following. The size, material, shape, relative arrangement and the like of each component mentioned below are not meant to limit the scope of the present invention, unless otherwise specified, and are intended to exemplify the present invention. The contents of the description regarding one embodiment or example can also be applied to other embodiments and examples. Besides, the size, positional relationship, and the like of members shown in the drawings may be exaggerated to clarify the description.

First Embodiment

FIGS. 1A to 1D mainly show the configuration of a light emitting module in a first embodiment of the present disclosure.

Figure 1B:
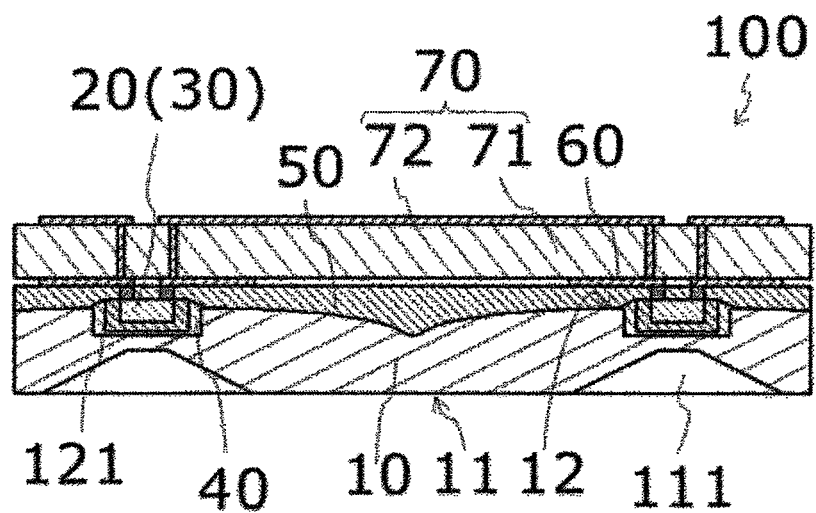
FIG. 1B is a partially enlarged schematic cross-sectional view of the light emitting module according to the first embodiment.
Figure 1C:
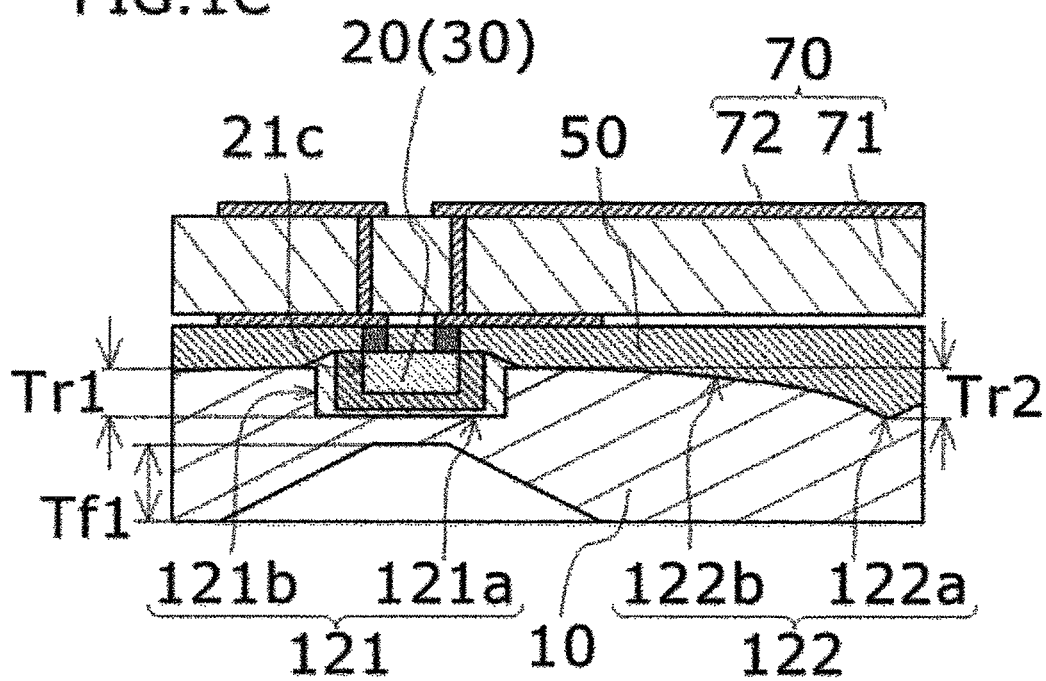
FIG. 1C is a partially enlarged schematic cross-sectional view of the light emitting module according to the first embodiment.
Figure 1D:
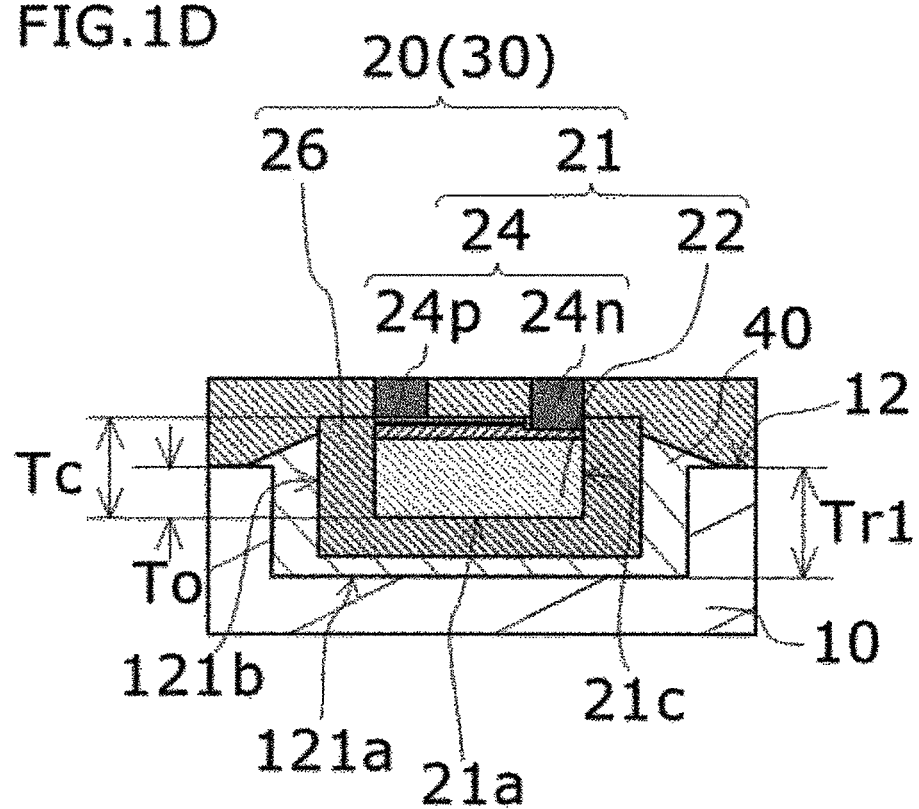
FIG. 1D is a partially enlarged schematic cross-sectional view of the light emitting module according to the first embodiment.

FIG. 1A is a schematic plan view of a light emitting module 100 according to the first embodiment. FIG. 1B is a partially enlarged schematic cross-sectional view showing the light emitting module 100 according to the first embodiment. Here, FIG. 1B shows the cross-sectional view taken along line IB (IB) indicated in a region S shown in FIG. 1A. FIG. 1C is an enlarged view of a portion that includes one light source member 20 and a second recess 122 shown in FIG. 1B. FIG. 1D is an enlarged view of the one light source member 20.

The light emitting module 100 includes a light guide plate 10, a plurality of light source members 20 joined to the light guide plate 10, and a sealing member 50. The light guide plate 10 has a first main surface 11 serving as a light extraction surface, and a second main surface 12 opposite to the first main surface 11. The light guide plate 10 has a plurality of first recesses 121 arranged in a matrix at the second main surface 12. Each light source member 20 includes a light emitting element 21 and a wavelength conversion member 26. The plurality of light source members 20 is joined to a joint member 40 on a bottom surface 121a of the first recess 121 on the second main surface 12 of the light guide plate 10. The sealing member 50 is disposed to cover the light source members 20 and the second main surface 12 of the light guide plate 10.

The light source member 20 is disposed such that at least a part of a side surface 21c of the light emitting element 21 is located within the first recess 121 in the cross-sectional view. In other words, the light source member 20 is disposed such that a main light emitting surface 21a of the light emitting element 21 is located lower than the second main surface 12 around the first recess 121 in the cross-sectional view.

The wavelength conversion member 26 covering the main light emitting surface 21a of each light emitting element 21 is irradiated with light emitted from the main light emitting surface 21a of the light emitting element 21. Then, the light from the light source member 20 enters the light guide plate 10 from the bottom surface 121a of the first recess 121 in the form of a mixture of the light from the light emitting element 21 and the light from the wavelength conversion member 26.

The wavelength conversion member 26 covering the side surfaces 21c of each light emitting element 21 is irradiated with the light emitted from the side surfaces 21c of the light emitting element 21. Then, the light exiting from the light source member 20 enters the light guide plate 10 from side surfaces 121b of the first recess 121 in the form of a mixture of the light from the light emitting element 21 and the light from the wavelength conversion member 26.

By placing at least a part of the light emitting element 21 within the first recess 121 of the light guide plate 10, the light emitted from the light source member 20 can be effectively spread laterally within the light guide plate 10. This can provide a light emitting module that enables surface emission with less unevenness of luminance over the entire first main surface 11 of the light guide plate 10.

A length T0 within which the side surface 21c of the light emitting element 21 faces the side surface 121b of the first recess 121 is preferably 20% to 100% and more preferably 50% to 100% of a length Tc of the side surface 21c of the light emitting element 21 (the distance between the main light emitting surface 21a and an electrode formation surface 21b).

When the light emitting element 21 has a semiconductor laminate 22 including an element substrate 22s, the side surface 121b of the first recess 121 faces the side surface of the element substrate 22s within a range of preferably 20% to 100% and more preferably 50% to 100% of the length of the side surface of the element substrate 22s in the cross-sectional view.

Each member constituting the light emitting module will be described in detail below.

[Light Guide Plate 10]

Figure 2B:
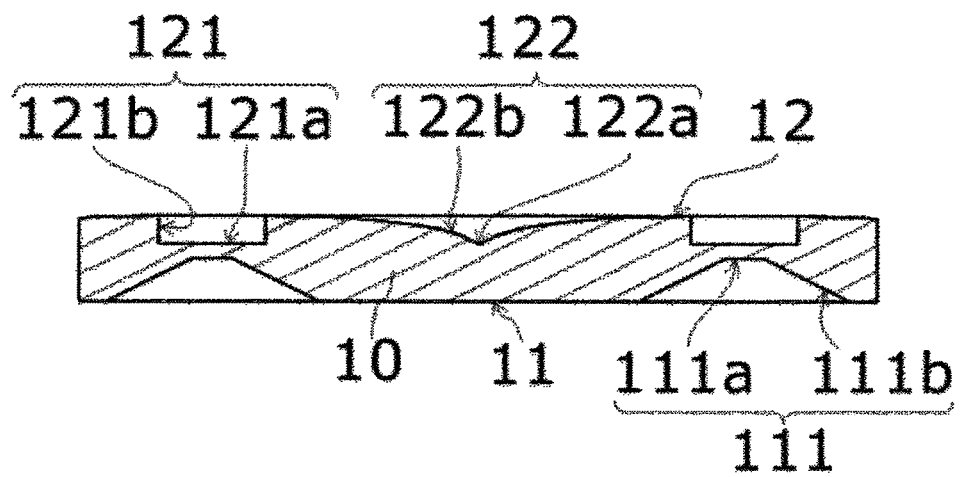
FIG. 2B is a partially enlarged schematic cross-sectional view showing an example of the light guide plate according to the first embodiment.

FIG. 2A is an enlarged view of the region S, which is a part of the light guide plate 10 shown in FIG. 1A. FIG. 2A illustrates respective plan views of the first main surface 11 and the second main surface 12, as well as a cross-sectional view taken along line IB (IB) in FIG. 1A. FIG. 2B is an enlarged cross-sectional view showing a part of FIG. 2A. The light guide plate 10 is a light-transmissive, plate-shaped member on which the light from the light source member 20 is incident and which guides the light emission in the plane. The light guide plate 10 has the first main surface 11 serving as a light extraction surface and the second main surface 12 opposite to the first main surface 11. The first recesses 121, in each of which the light source member 20 is disposed, are provided in the first main surface 11.

When the light guide plate 10 has a quadrangular shape in the planar view, the size of one side of the light guide plate 10 in the planar view may be, for example, approximately 1 cm to 200 cm and preferably approximately 3 cm to 30 cm. The thickness of the light guide plate 10 may be approximately 0.1 mm to 5 mm and preferably 0.5 mm to 3 mm. The term "thickness" as used herein refers to the thickness of an object on the assumption that there is no concave or convex portion on a surface of the object, for example, even if a concave or convex portion is actually present at the first main surface 11 or second main surface 12.

The planar shape of the light guide plate 10 may be, for example, a substantially rectangular shape, a substantially circular shape, or the like.

Examples of the material usable for the light guide plate 10 include resin materials, such as a thermoplastic resin and a thermosetting resin, and optically transparent materials, such as glass. Examples of the thermoplastic resin include an acrylic resin, polycarbonate, a cyclic polyolefin, polyethylene terephthalate, polyester, and the like. Examples of the thermosetting resin include an epoxy resin, a silicone resin, and the like. In particular, the thermoplastic resin material is preferable because it may be used to efficiently manufacture the light guide plate by injection molding. Among these materials, a polycarbonate which is inexpensive and has high transparency is preferable. Specifically, in the case of performing a step of bonding a wiring board after joining the light source member 20 to the light guide plate 10, a step of applying heat at a high temperature, such as reflow soldering, may be omitted. Due to this, even a thermoplastic material with low heat resistance, such as polycarbonates, may be used for the light guide plate.

The light guide plate 10 may be formed of a single layer or alternatively may be formed by laminating a plurality of light-transmissive layers. When the plurality of light-transmissive layers are laminated, a layer with a different refractive index, for example, an air layer, may be provided between arbitrary adjacent light-transmissive layers. Consequently, the light is more likely to be diffused, thus making it possible to produce a light emitting module that reduces unevenness of luminance.

(First Recess: Light Source Member Arrangement Portion)

The light guide plate 10 may include a plurality of first recesses 121 on the second main surface 12 side. The light source member 20 is disposed in each of the first recesses 121.

The plurality of first recesses 121 are arranged two-dimensionally in the planar view of the light guide plate 10. Preferably, the plurality of first recesses 121 are arranged two-dimensionally along two orthogonal directions, i.e., an x direction (lateral direction) and a y direction (longitudinal direction). As shown in FIG. 1A, an arrangement pitch in the x direction between adjacent first recesses 121 and an arrangement pitch in the y direction therebetween may be the same or different from each other. These two arrangement directions are not necessarily orthogonal to each other. The arrangement pitch in the x direction or the y direction is not limited to an equal interval and may be an unequal interval. For example, the first recesses 121 may be arranged so as to make an interval therebetween wider from the center of the light guide plate 10 toward its periphery.

The size of the first recess 121 (the area of an opening) in the planar view is preferably substantially equal to or larger than the shape of the light source member 20 in the planar view. For example, the area of the opening of the first recess 121 in the planar view can be set to 100% to 200% of the area of the light source member 20 in the planar view.

The planar shape of the opening of the first recess 121 can be, for example, a substantially rectangular shape or a substantially circular shape. The planar shape of the opening of the first recess 121 can be adjusted depending on the arrangement pitch between the first recesses 121 or the like (the distance between the centers (optical axes) of the two closest first recesses 121). For example, when the arrangement pitch between the first recesses 121 is substantially uniform, the planar shape of the first recess 121 is preferably substantially circular or square. Among these shapes, especially, the planar shape of the first recess 121 is set to the substantially circular shape, thereby making it possible to spread the light from the light source member 20 well.

For example, the planar shape of the opening of the first recess 121 is quadrangular; each of the longitudinal and lateral dimensions of the light emitting element 21 in the planar view is approximately 1,000 μm or less; and the thickness of the wavelength conversion member 26 covering the side surfaces 21c of the light emitting element 21 is approximately 0.1 mm to 5 mm. In this case, the arrangement pitch between the first recesses 121 can be, for example, approximately 0.5 mm to 50 mm, and preferably approximately 3 mm to 30 mm.

The planar shape of the bottom surface 121a of the first recess 121 is preferably set to the same as the planar shape of the opening of the first recess 121. However, the planar shape of the bottom surface 121a of the first recess 121 is not limited thereto and may be different from the planar shape of the opening of the first recess 121. The bottom surface 121a of the first recess 121 can have a size that is the same as or smaller than that of the opening of the first recess 121.

A depth Tr1 of the first recess 121, i.e., the distance from the bottom surface 121a of the first recess 121 to the opening thereof (the second main surface) is preferably a depth at which at least a part of the side surface 21c of the light emitting element 21 can be located within the first recess 121. In other words, at least a part of the side surface 121b of the first recess 121 is preferably located beside the side surface 21c of the light emitting element 21.

The light emitting element 21 is disposed on the bottom surface 121a of the corresponding first recess 121 via the wavelength conversion member 26 covering the main light emitting surface 21a within the first recess 121. Thus, to place the side surface 21c of the light emitting element 21 within the first recess 121, the depth Tr1 of the first recess 121 is preferably larger than the thickness of a portion of the wavelength conversion member 26 located between the main light emitting surface 21a of the light emitting element 21 and the bottom surface 121a of the first recess 121.

When the light-transmissive joint member 40 is disposed between the wavelength conversion member 26 and the bottom surface 121a of the first recess 121, the depth Tr1 of the first recess 121 is preferably larger than the total of the thickness of the portion of the wavelength conversion member 26 between the main light emitting surface 21a of the light emitting element 21 and the bottom surface 121a of the first recess 121 and the thickness of the joint member 40.

For example, the length of the side surface 21c of the light emitting element 21 (the distance between the main light emitting surface 21a and the electrode formation surface 21b) is approximately 50 µm to 200 µm, and the thickness of the wavelength conversion member 26 or the total thickness of the wavelength conversion member 26 and the joint member 40 is approximately 50 µm to 600 µm. In this case, the depth Tr1 of the first recess 121 can be 50 µm to 5000 µm and preferably 100 µm to 350 µm. When the light guide plate 10 includes an optically functional portion 111 to be mentioned later, the distance between the optically functional portion 111 and the first recess 121 can be set appropriately as long as the optically functional portion 111 is apart from the recess 121.

The side surface 121b of the first recess 121 can be orthogonal or inclined to the bottom surface 121a of the first recess 121. An inclination angle of the side surface 121b can be in a range of 45 degrees to 90 degrees with respect to the bottom surface 121a. The side surface 121b of the first recess 121 in the cross-sectional view can form a straight line or a curved line.

(Second Recess: Reflector)

The light guide plate 10 may preferably include a plurality of second recesses 122 located at the second main surface 12. Each second recess 122 may function as a reflector that reflects the light from the light source member 20 disposed inside the first recess 121 to the first main surface 11 side. For this reason, the second recess 122 is preferably disposed to surround one corresponding first recess 121 in which the light source member 20 is disposed, in the top view.

When each second recess 122 is disposed to surround the one first recess 121 in which the light source member 20 is disposed, for example, the second recesses may be provided so as to divide the second main surface of the light guide plate into a plurality of divided regions, and the first recess 121 may be provided in each of the plurality of divided regions. In this case, in the top view, a part of the second recess 122 that surrounds the one first recess 121 may also serve as a part of another second recess 122 that surrounds an adjacent first recess 121. That is, when a part of the second recess 122 is located between two first recesses 121 in the cross-sectional view, the part of the second recess 122 is shared between the two adjacent first recesses 121. For example, as shown in FIG. 2B, a side surface 122b of the second recess 122 located on the right side relative to a bottom portion 122a of the second recess 122 at its center reflects the light from the light source member disposed in the first recess 121 located on the right side. Similarly, the side surface 122b of the second recess 122 located on the left side relative to the bottom portion 122a of the second recess 122 at its center reflects the light from the light source member disposed in the first recess 121 located on the left side.

Thus, as shown in FIG. 2A, the second recesses 122 may have the bottom portions 122a in a grid pattern so that the second recess 122 surrounding one first recess 121 may also function as a portion of another second recess 122 that surrounds the adjacent first recess 121.

Each side surface 122b of the second recess 122 in the cross-sectional view may form a straight line, a curved line, or a combination thereof. When the side surface of the second recess 122 is a curved surface, its curvature may be constant, or alternatively the side surface may have any curvature depending on its position. For example, the second recess 122 exemplified in FIG. 1C or the like has the curved side surface 122b whose curvature gradually changes over a portion of the second recess 122 that is continuous to the second main surface 12. For this kind of second recess 122, the boundary between the second recess 122 and the second main surface 12 may not be clearly visible.

A low refractive index member that has a refractive index lower than that of the light guide plate 10 may be disposed in the second recess 122. Examples of the material suitable for the low refractive index member include air, a resin material, and a glass material. In addition, a light reflective member may also be disposed in the second recess 122. As the light reflective member, a light reflective member that is made of the same material as the sealing member 50 mentioned later may be used. In addition, a part of the sealing member 50 may be disposed in each of the plurality of second recesses 122.

As shown in FIG. 1C, a depth Tr2 of the bottom portion 122a of the second recess 122 may be set substantially the same as the depth Tr1 of the first recess 121. The bottom portion 122a of the second recess 122 may be located at substantially the same height as a light emitting surface 20a of the light source member 20.

(Optically Functional Portion)

The light guide plate 10 may include the optically functional portions 111 on the first main surface 11 side. The optically functional portion 111 may have, for example, the function of spreading the light in the plane of the light guide plate 10.

Each optically functional portion 111 is preferably provided at a position corresponding to each of the plurality of first recesses 121, that is, at a position of the light guide plate opposite to the light source member 20 disposed on the second main surface 12 side. In particular, the optical axis of the light source member 20 and the optical axis of the optically functional portion 111 preferably substantially coincide with each other. For example, when the recess of the optically functional portion 111 is a cone or a frustum, the top or the central axis thereof preferably substantially coincides with the optical axis of the light source member 20. An area of a cross section of the optically functional portion may decrease toward the light emitting surface of the light emitting element. When the recess of the optically functional portion 111 is a truncated pyramid, its surface corresponding to its top portion is preferably located on the optical axis of the light source member 20.

The optically functional portion 111 may be a conical or frustum-shaped recess that is provided on the first main surface 11 side. Specifically, examples of the shape of the conical recess include polygonal pyramid shapes, such as a cone, a quadrangular pyramid, and a hexagonal pyramid, while examples of the shape of the frustum-shaped recess include a circular truncated cone, and frustums of polygonal pyramids, such as a frustum of a quadrangular pyramid and a frustum of a hexagonal pyramid. A side surface 111b of the optically functional portion 111 may form a straight line or a curved line in the cross-sectional view.

The size of an opening of the optically functional portion 111 in the planar view may be set as appropriate. Specifically, the area of the opening of the optically functional portion 111 may be set to, for example, 100% to 300% of the area of the bottom surface 121a of the first recess 121. When the optically functional portion 111 is the recess with a truncated pyramid shape, the area of a bottom surface 111a (the surface corresponding to the top portion of the truncated pyramid) in the planar view may be, for example, 50% to 100% of the area of the light source member 20 in the planar view, or alternatively may be 20% to 100% of the area of the bottom surface 121a of the first recess 121. The optically functional portion 111 shown in FIGS. 1A to 1D by way of example is a frustoconical recess that has a circular opening on the first main surface 11, and the diameter of the opening is larger than the diameter of the light source member 20 and further larger than the diameter of the first recess 121.

Figure 3A:
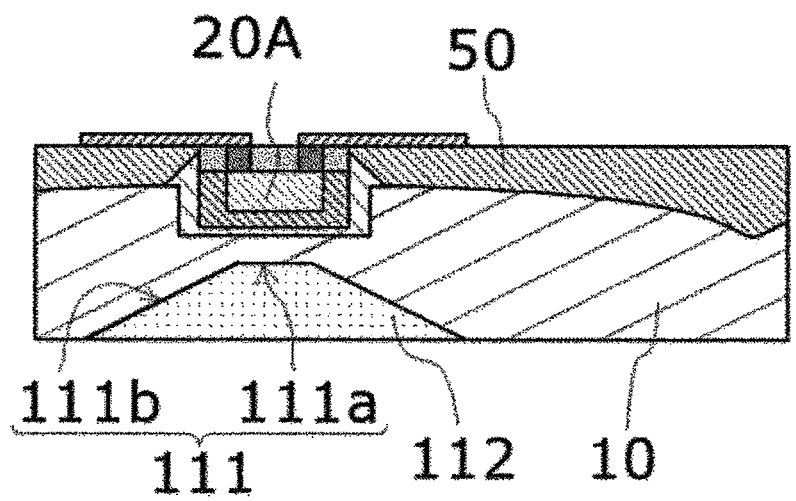
FIG. 3A is a partially enlarged schematic cross-sectional view showing an example of the light emitting module according to the first embodiment.
Figure 3B:
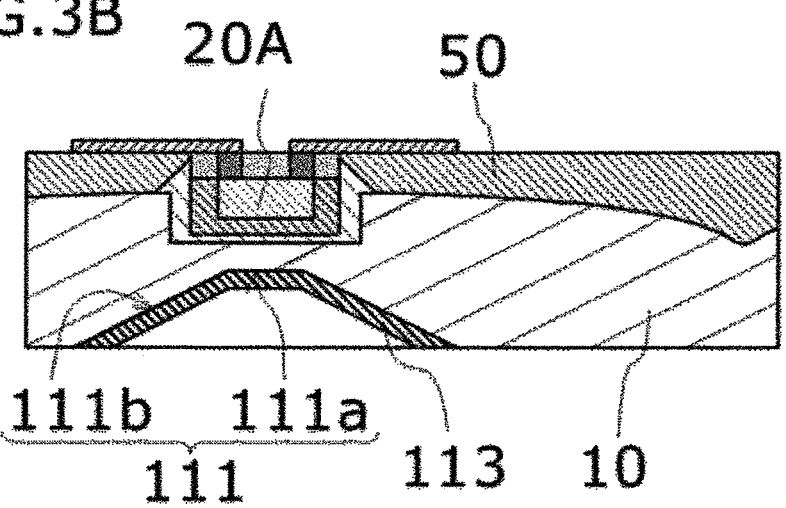
FIG. 3B is a partially enlarged schematic cross-sectional view showing an example of the light emitting module according to the first embodiment.

As shown in FIG. 3A, a material with a different refractive index from that of the light guide plate 10 (for example, air, a low refractive index material 112, or the like) may be disposed in the recess used as the optically functional portion 111. Furthermore, as shown in FIG. 3B, a first reflective member 113 that reflects the light from the light source member 20 may be disposed on the inner surface of the recess. Examples of the material suitable for the first reflective member 113 include metal, a white resin material, a DBR film, and the like.

[Light Source Member]

The light source member 20 includes the light emitting element 21 and the wavelength conversion member 26. The wavelength conversion member 26 is a member that covers the main light emitting surface 21a and the side surfaces 21c of the light emitting element 21. The wavelength conversion member 26 mainly contains a resin material and a wavelength conversion material.

Figure 4A:
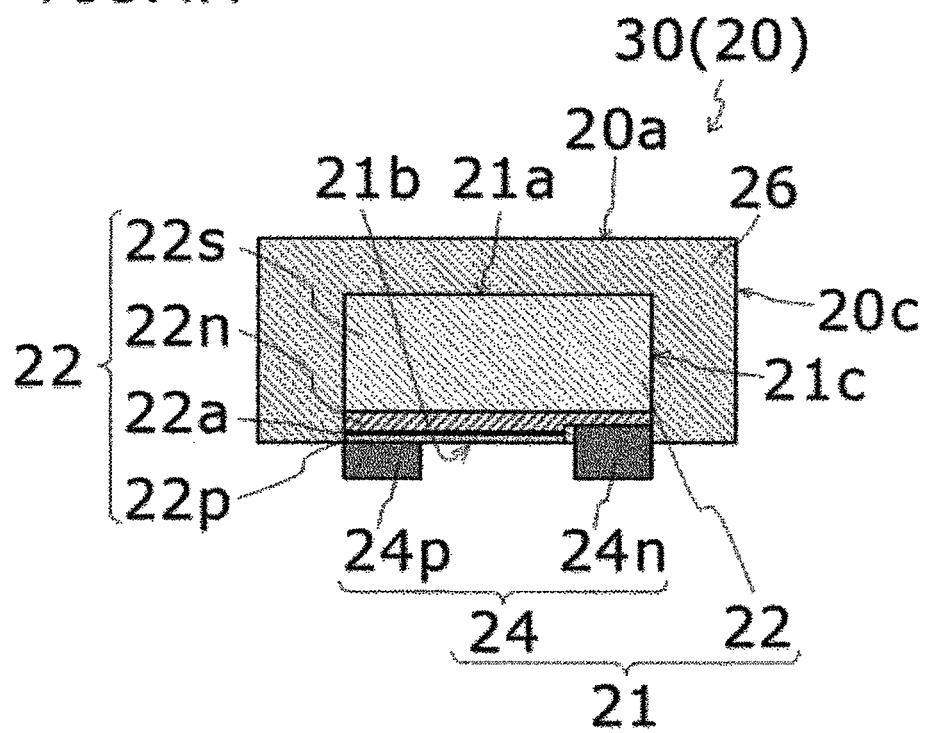
FIG. 4A is a schematic cross-sectional view showing an example of a light source member in the light emitting module according to the first embodiment.
Figure 4B:
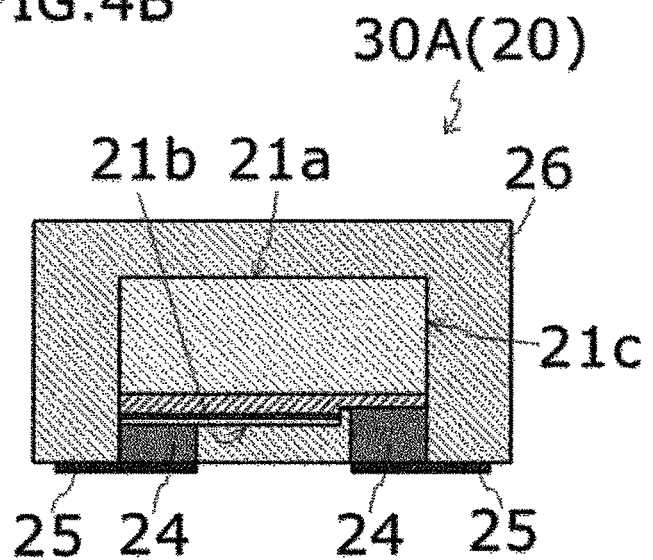
FIG. 4B is a schematic cross-sectional view showing an example of the light source member in the light emitting module according to the first embodiment.
Figure 4C:
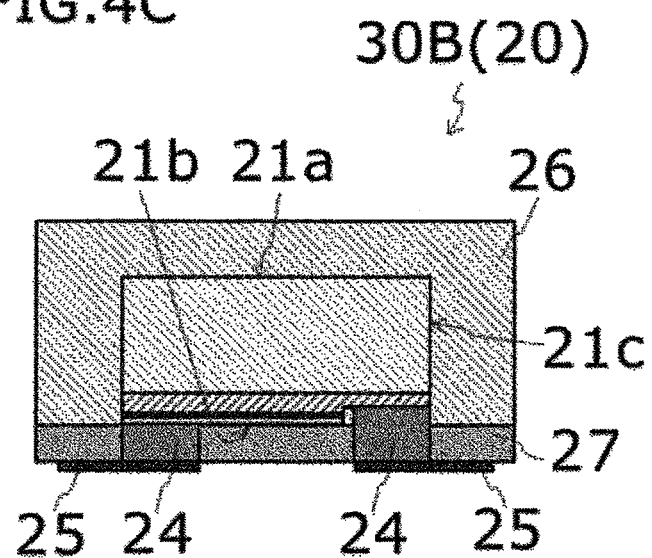
FIG. 4C is a schematic cross-sectional view showing an example of the light source member in the light emitting module according to the first embodiment.

Regarding the light source member 20, a light emitting device 30 including the light emitting element 21 and the wavelength conversion member 26, such as that as shown in FIGS. 4A to 4C, may be used as the light source member 20. Alternatively, the wavelength conversion member 26 may be disposed in the first recess 121 of the light guide plate 10 and then the light emitting element 21 may be disposed to be embedded in the wavelength conversion member 26, thereby configuring the light source member 20.

The light emitting device 30 may have a structure, for example, shown in FIGS. 4A to 4C. What all the light emitting devices mentioned above have in common is that the wavelength conversion member 26 is disposed to cover the main light emitting surface 21a and the side surfaces 21c of the light emitting element 21.

The light emitting device 30 shown in FIG. 4A includes the wavelength conversion member 26 which covers the main light emitting surface 21a and side surfaces 21c of the light emitting element 21. In this case, the electrode formation surface 21b of the light emitting element 21 is exposed without being covered with the wavelength conversion member 26. The bottom surface and side surfaces of a pair of electrodes 24 are also exposed. Since the electrode formation surface 21b is incorporated in a part of the light emitting module and then covered with the sealing member 50, there is no problem even if the electrode formation surface 21b is exposed to the outside in this state of the light emitting device 30.

In a light emitting device 30A shown in FIG. 4B, the wavelength conversion member 26 is disposed to cover the electrode formation surface 21b as well as the main light emitting surface 21a and the side surfaces 21c of the light emitting element 21. The side surfaces of the pair of electrodes 24 are also covered with the wavelength conversion member 26. The bottom surfaces of the pair of electrodes 24 are covered with a first metal film 25 but not with the wavelength conversion member 26. The area of the first metal film 25 may be set larger than the area of the electrode 24. Thus, for example, the light emitting properties of the light emitting device 30A can be easily detected. Consequently, when incorporating the light emitting device in a part of the light emitting module, the chromaticity, luminance, and the like of the light emitting device can be easily selected, thereby producing the light emitting module with less unevenness of color and luminance.

A light emitting device 30B shown in FIG. 4C includes the wavelength conversion member 26 which covers the main light emitting surface 21a and the side surfaces 21c of the light emitting element 21. The electrode formation surface 21b and the side surfaces of the pair of electrodes 24 are covered with a second reflective member 27. The bottom surfaces of the pair of electrodes 24 are exposed without being covered with the wavelength conversion member 26 and the second reflective member 27. The bottom surfaces of the electrodes 24 exposed from these members are covered with the first metal film 25. The electrode formation surface 21b is covered with the second reflective member 27, thus suppressing the absorption of light by the electrodes 24. The use of the first metal film 25 which is larger than the electrode 24 enables easy detection of the light emitting properties, thereby producing a light emitting module with less unevenness of color and luminance, like the light emitting device 30A shown in FIG. 4B.

(Light Emitting Element)

The light emitting element 21 can utilize a well-known semiconductor light emitting element. In the first embodiment, a light emitting diode is embodied as the light emitting element 21.

The light emitting element 21 includes, for example, the light-transmissive element substrate 22s made of sapphire or the like, and the semiconductor laminate 22 including semiconductor layers laminated on the element substrate 22s. The semiconductor laminate 22 includes a light emitting layer 22a, and an n-type semiconductor layer 22n and a p-type semiconductor layer 22p which sandwich the light emitting layer 22a therebetween. The pair of electrodes 24, namely, an n-side electrode 24n and a p-side electrode 24p are electrically connected to the n-type semiconductor layer 22n and the p-type semiconductor layer 22p, respectively. The light emitting element 21 is disposed such that the main light emitting surface 21a included in the element substrate 22s faces the bottom surface 121a of the first recess 121 of the light guide plate 10.

The light emitting element 21 can select an element that emits light at an arbitrary wavelength. For example, a light emitting element that uses a nitride-based semiconductor ($In_xAl_yGa_{1-x-y}N$, $0 \leq X$, $0 \leq Y$, $X+Y \leq 1$) can be used as the element that emits blue or green light. The emission wavelength of the light emitting element can be varied by the material of the semiconductor laminate and the mixed crystal ratio thereof. The composition, emission color, size, the number of the light emitting elements used, and other factors thereof can be selected as appropriate in accordance with the purpose. The light emitting element 21 preferably includes a nitride-based semiconductor ($In_xAl_yGa_{1-x-y}N$, $0 \le X$, $0 \le Y$, $X+Y \le 1$), which is capable of emitting light with a short wavelength that can efficiently excite the waveform conversion member.

The shape of the light emitting element 21 can be a quadrilateral, such as a square or a rectangle, or a polygon, such as a triangle or a hexagon. Each of the dimensions in the vertical and horizontal directions of the light emitting element 21 in the planar view is preferably, for example, 1,000 μm or less, more preferably 500 μm or less, and still more preferably 200 μm or less. The use of such a light emitting element can achieve a high-definition image when performing local dimming of the liquid crystal display device.

(Wavelength Conversion Member)

The wavelength conversion member 26 contains a wavelength conversion material, such as a phosphor, that converts light emitted from the light emitting element 21 into light with a different wavelength. For example, the wavelength conversion member 26 can be formed of a single layer or multiple layers.

The wavelength conversion member 26 includes a light-transmissive material as a base material and a particulate phosphor as the wavelength conversion material.

The light-transmissive material is translucent and thus transmits the light from at least the light emitting element 21. The light-transmissive material transmits 60% or more and preferably 90% or more of the light emitted from the light emitting element 21. As the material of the wavelength conversion member 26, a light-transmissive thermosetting resin material, such as an epoxy resin or a silicone resin, can be used.

Examples of the phosphor include yttrium aluminum garnet based phosphors (e.g., $Y_3(Al,Ga)_5O_{12}:Ce$), lutetium aluminum garnet based phosphors (e.g., $Lu_3(Al,Ga)_5O_{12}:Ce$), terbium aluminum garnet based phosphors (e.g., $Tb_3(Al,Ga)_5O_{12}:Ce$), silicate based phosphors (e.g., $(Ba,Sr)_2SiO_4:Eu$), and chlorosilicate based phosphors (e.g., $Ca_8Mg(SiO_4)_4Cl_2:Eu$). Further, examples of the nitride based phosphor include ß-sialon based phosphors (e.g., $Si_{6-z}Al_zO_zN_{8-z}:Eu$ ($0<z<4.2$)), α-sialone based phosphors (e.g., $M_z(Si,Al)_{12}(O,N)_{16}$ (where $0<z\le2$, M is Li, Mg, Ca, Y, or a lanthanoid element excluding La and Ce), nitrogen-containing calcium aluminosilicate (CASN or SCASN) based phosphors (e.g., $(Sr,Ca)AlSiN_3:Eu$) and the like. Moreover, examples of the phosphor include phosphors represented by a general formula (I), i.e., $Ma_xMb_yAl_3N_z:Eu$, where Ma is at least one element selected from the group consisting of Ca, Sr and Ba; Mb is at least one element selected from the group consisting of Li, Na, and K; and x, y and z respectively satisfy $0.5 \le x \le 1.5$, $0.5 \le y \le 1.2$, and $3.5 \le z \le 4.5$. Furthermore, examples of the phosphor include SGS based phosphors (e.g., $SrGa_2S_4:Eu$). In addition, examples of the phosphor include manganese-activated fluoride based phosphors represented by a general formula (II), i.e., $A_2[M_{1-a}Mn_aF_6]$ where A is at least one element selected from the group consisting of K, Li, Na, Rb, Cs, and $NH_4$; M is at least one element selected from the group consisting of Group 4 and Group 14 elements; and "a" satisfies a range of $0<a<0.2$. A typical example of the manganese-activated fluoride-based phosphor is a phosphor of a manganese-activated potassium fluorosilicate (e.g., KSF ($K_2SiF_6$):Mn).

One wavelength conversion member can contain one or more kinds of phosphors. The plurality of kinds of phosphors may be used in combination or used by being laminated on each other. For example, while using the light emitting element 21 that emits bluish light, the wavelength conversion member can contain a ß-sialon phosphor that emits greenish light, and a fluoride based phosphor, such as a KSF-based phosphor, that emits reddish light. The use of these two kinds of phosphors can widen the color reproduction range achieved by the light emitting module. The phosphor may be composed of quantum dots.

Phosphor particles may be located anywhere inside the wavelength conversion member. The phosphor particles may be distributed substantially uniformly or partially ununiformly inside the wavelength conversion member.

The wavelength conversion member may contain a light diffusion material. Examples of the light diffusion material include fine particles of $SiO_2$, $TiO_2$, $Al_2O_3$, ZnO, and the like.

In the light emitting devices shown in FIGS. 4A to 4C, the thickness of a portion of the wavelength conversion member 26 that covers the main light emitting surface 21a of the light emitting element 21 can be set to 30 μm to 50 μm. The thickness of a portion of the wavelength conversion member 26 that covers the side surface 21c of the light emitting element 21 can be set to 10 μm to 1,000 μm. The thickness of the portion of the wavelength conversion member 26 that covers the main light emitting surface 21a of the light emitting element 21 is preferably the same as the thickness of the portion of the wavelength conversion member 26 that covers the side surface 21c of the light emitting element 21. However, these thicknesses are not limited thereto and may be different from each other.

In the light emitting device 30A shown in FIG. 4B, the thickness of a portion of the wavelength conversion member 26 that covers the electrode formation surface 21b of the light emitting element 21 can be set to approximately 5 μm to 50 μm. The thickness of the portion of the wavelength conversion member 26 that covers the electrode formation surface 21b of the light emitting element 21 can be substantially the same as the thickness of the pair of electrodes 24.

Suppose that the wavelength conversion member 26 is disposed in the first recess 121 of the light guide plate 10 without using the light emitting device 30 as the light source member 20. Hereinafter, a description will be given of the wavelength conversion member 26 in this case.

As shown in FIG. 5, the wavelength conversion member 26 is preferably disposed across an entire region sandwiched between the main light emitting surface 21a of the light emitting element 21 and the bottom surface 121a of the first recess 121. Furthermore, the wavelength conversion member 26 is preferably disposed to cover the entire bottom surface 121a of the first recess 121. In addition, the wavelength conversion member 26 is preferably disposed across an entire region sandwiched between each side surface 21c of the light emitting element 21 and each side surface 121b of the first recess 121.

(Second Reflective Member)

When using the light emitting device 30B, such as that shown in FIG. 4C, as the light source member 20, the light emitting device 30B includes the second reflective member 27 that covers the electrode formation surface 21b of the light emitting element 21 and the side surfaces of the pair of electrodes 24. The thickness of the second reflective member 27 can be set to, for example, approximately 5 μm to 200 μm. The height of the second reflective member 27 can be substantially the same as the height of the pair of electrodes 24.

The second reflective member 27 has a reflectance of 60% or more and preferably 90% or more for the light emitted from the light emitting element 21. The material of the second reflective member 27 is preferably made of a resin material that contains a white pigment or the like. In particular, a silicone resin containing a titanium oxide is preferable.

(First Metal Film)

When using the light emitting device 30A or 30B, such as that shown in FIG. 4B or 4C, as the light source member 20, that is, when the electrode formation surface 21b of the light emitting element 21 is covered with the wavelength conversion member 26 or the second reflective member 27, the light emitting device 30A or 30B may include the metal films 25 that are electrically connected to the pair of electrodes 24 and cover the respective bottom surfaces of the pair of electrodes 24. The material of the metal film 25 can have a laminated structure formed by laminating, for example, Cu, Ni, and Au films (Cu/Ni/Au) in this order. The metal film 25 may be disposed to continuously cover the second reflective member 27 or the wavelength conversion member 26, which covers the side surfaces of the pair of electrodes 24, and the corresponding electrode 24.

[Joint Member]

When using any one of the light emitting devices shown in FIGS. 4A to 4C as the light source member 20, the light emitting device and the light guide plate 10 are joined together by the light-transmissive joint member 40. The joint member 40 serves to cause the light emitted from the light emitting device 30 as the light source member 20 to propagate to the light guide plate 10. The joint member 40 is disposed between the bottom surface 121a of the first recess 121 on the second main surface 12 side of the light guide plate 10 and the light emitting device 30. The joint member 40 is disposed between the light emitting device 30 and the side surfaces 121b of the first recess 121. The joint member 40 may extend up to the second main surface 12 of the light guide plate 10.

The joint member 40 is translucent and thus transmits 60% or more and preferably 90% or more of the light emitted from the light source member 20 (light emitting device 30) therethrough. The joint member 40 is preferably formed of a material that has substantially the same refractive index as that of the material of the light guide plate 10. Examples of the base material of the joint member 40 suitable for use include an epoxy resin, a silicone resin, a resin made of a mixture of these resins, and light-transmissive materials, such as glass. From the viewpoint of light resistance and formability of the joint member 40, it is advantageous to select a silicone resin as the base material of the joint member 40.

[Sealing Member 50]

The sealing member 50 may be a light reflective member that covers the plurality of light source members 20 and the second main surface 12 of the light guide plate 10. By using the sealing member 50 as the light reflective member, the light emitted from the light source member 20 can be efficiently taken in by the light guide plate 10.

The sealing member 50 may have a reflectance of 60% or more and preferably 90% or more for the light emitted from the light source member 20. The material of the sealing member 50 is preferably made of a resin material that contains a white pigment or the like. In particular, a silicone resin containing a titanium oxide is preferable. Thus, the light emitting module 100 can be produced at low cost by using a large amount of inexpensive raw materials, such as a titanium oxide, as the material which can be used in a relatively large amount in order to cover the entire surface of the light guide plate 10.

[Second Metal Film]

In the light emitting module 100, second metal films 60 that are electrically connected to the respective electrodes 24 of the plurality of light source members 20 may be provided over the sealing member 50. The second metal films 60 may be disposed on the sealing member 50. When the light emitting device including the first metal film 25, such as that shown in FIGS. 4B and 4C, is used as the light source member 20, the second metal film 60 may be disposed to be electrically connected to the corresponding first metal film 25. The second metal film 60 may be formed in contact with the electrode 24 after removing the first metal film 25 in the manufacturing process, even when using the light emitting device including the first metal film 25. The material of the second metal film 60 can have a laminated structure formed by laminating, for example, Cu, Ni, and Au films (Cu/Ni/Au) in this order.

[Wiring Board]

As shown in FIG. 1B, the light emitting module 100 may include a wiring board 70. The wiring board 70 is a substrate that includes an insulating base material 71, wirings 72 electrically connected to the plurality of light source members 20, and the like. By providing the wiring board 70, a complicated configuration of the wirings required for local dimming or the like can be easily formed. In the wiring board 70, after the light source member 20 is connected to the light guide plate 10 and then the sealing member 50 and the second metal films 60 are formed thereover, the wirings 72 on the wiring board 70, which have been prepared in advance, can be joined to the second metal films 60.

The wiring board 70 includes, for example, conductive members filled in a plurality of via holes provided in the insulating base material 71, and the wirings 72 establishing electrical connection to the conductive members at both surfaces of the base material 71.

The wiring board 70 may have a laminated structure. For example, a metal plate having an insulating layer provided on its surface may be used as the wiring board 70. The wiring board 70 is a thin-film transistor (TFT) substrate that has a plurality of TFTs.

For example, ceramic or resin can be used as the material of the base material 71 of the wiring board 70. From the viewpoint of low cost and formability, the resin may be selected as the material of the base material 71. Examples of the resin can include a phenolic resin, an epoxy resin, a polyimide resin, a BT resin, polyphthalamide (PPA), polyethylene terephthalate (PET), unsaturated polyesters, composite materials, such as epoxy glass, and the like. In addition, the base material 71 may be a rigid substrate or a flexible substrate.

The wiring 72 is made of, for example, a conductive foil (conductor layer) provided on the base material 71. The wirings 72 are electrically connected to the plurality of light source members 20. The material of the wirings 72 preferably has a high thermal conductivity. As such a material, a conductive material, such as copper, can be used. The wiring 72 can be formed by plating, application of a conductive paste, printing, or the like, and the thickness of the wiring 72 is, for example, approximately 5 µm to 50 µm.

The wiring board 70 may be joined to the light guide plate 10 or the like in any method. For example, the wiring board 70 can be joined to the light guide plate 10 by disposing and pressure-bonding a bonding sheet between the surface of the sealing member 50 provided on the side of the light guide plate 10 opposite to the first main surface 11 and the surface of the wiring board 70. The electric connection between the wiring 72 on the wiring board 70 and the light source member 20 may be performed in any method. For example, the conductive members made of metal embedded in the via holes can be joined to the second metal film 60 by melting the metal through application of pressure and heat.

An example of a method for manufacturing such a light emitting module may include the following steps:

(1) preparing a plurality of light source members, each including a light emitting element and a wavelength conversion member covering a main light emitting surface and a side surface of the light emitting element;

(2) preparing a light guide plate that has a first main surface serving as a light extraction surface and a second main surface disposed opposite to the first main surface and including a plurality of recesses;

(3) placing a light source member on a bottom surface of each of the plurality of recesses such that a side surface of the plurality of recesses at least faces the side surface of the light emitting element; and (4) disposing a sealing member to cover the light source member and the second main surface.

Each step of the method for manufacturing the light emitting module 100 will be described in detail below.

Figure 6C:
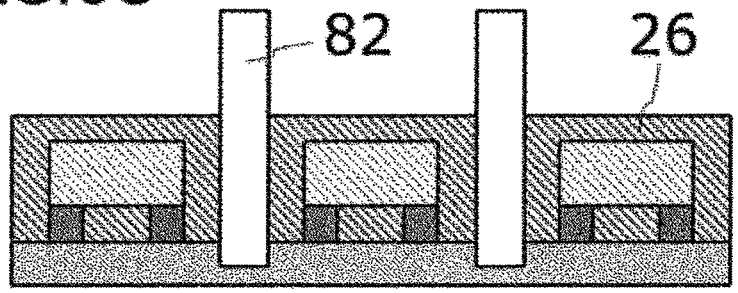
FIG. 6C is a partially enlarged schematic cross-sectional view showing an example of another manufacturing step of the light source member.

(1) Step of preparing the light source members (light emitting devices), each including the light emitting element and the wavelength conversion member The light source member 20 may be manufactured, for example, in steps shown in FIGS. 6A to 6D, 7A and 7B. First, as shown in FIG. 6A, a plurality of light emitting elements 21 are disposed on a support 80 with the pair of electrodes facing downward. Then, as shown in FIG. 6B, the wavelength conversion member 26 is formed to embed the light emitting elements 21 therein. The wavelength conversion member 26 may be formed, for example, by disposing an uncured material of the wavelength conversion member 26 before curing, on the support 80, then printing the material of the wavelength conversion member 26 thereon using a squeegee 81 or the like, and finally curing the material of the wavelength conversion member 26.

Figure 7A:
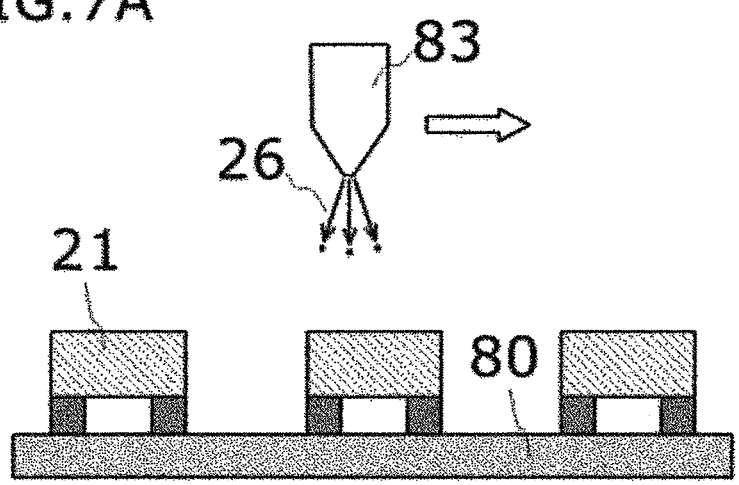
FIG. 7A is a partially enlarged schematic cross-sectional view showing an example of a manufacturing step of the light source member.
Figure 7B:
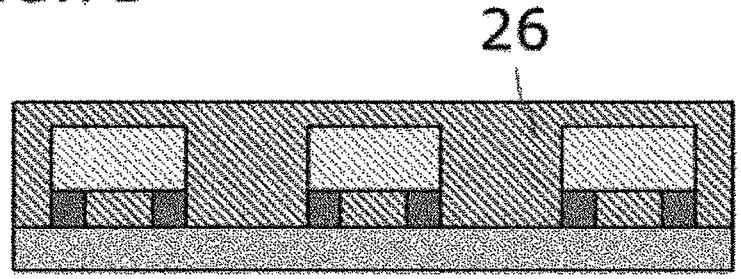
FIG. 7B is a partially enlarged schematic cross-sectional view showing an example of another manufacturing step of the light source member.

Alternatively, the wavelength conversion member 26 may be formed by spraying an uncured material of the wavelength conversion member 26 before curing using a spray nozzle 83 as shown in FIG. 7A, forming the material of the wavelength conversion member 26 to embed therein the light emitting elements 21 as shown in FIG. 7B, and finally curing the material of the wavelength conversion member 26.

Figure 6D:
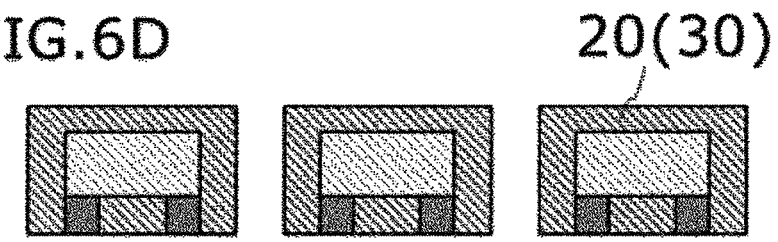
FIG. 6D is a partially enlarged schematic cross-sectional view showing an example of another manufacturing step of the light source member.

Then, as shown in FIG. 6C, the wavelength conversion member 26 is cut by using a cutting blade 82, such as a dicer, thus producing the light emitting devices 30 serving as the light source members 20 as shown in FIG. 6D.

Figure 8A:
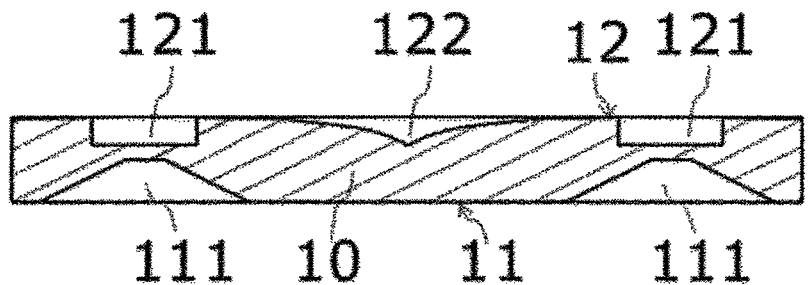
FIG. 8A is a partially enlarged schematic cross-sectional view showing an example of a manufacturing step of the light emitting module according to the first embodiment.

(2) Step of preparing the light guide plate that has the first main surface serving as the light emitting surface and the second main surface disposed opposite to the first main surface and including the plurality of recesses First, the light guide plate 10 is prepared. As shown in FIG. 8A, the plurality of first recesses 121, each having an opening with a substantially quadrangular shape, are provided at the second main surface 12 of the light guide plate 10. The second main surface 12 further includes the second recesses 122, each located between the adjacent first recesses 121. Each second recess 122 is disposed to surround the corresponding first recess 121 in the top view as shown in FIG. 2A. The optically functional portions 111, each of which is a frustoconical recess, are provided in the first main surface 11 opposite to the second main surface 12.

Such a light guide plate 10 may be prepared by, for example, injection molding, transfer molding, compression molding, or the like. The first recesses 121 and the second recesses 122 of the light guide plate 10 and the optically functional portion 111 may be collectively formed by a mold when forming the light guide plate 10. In this way, the positional deviation of the recesses in the light guide plate and the optically functional portion may be suppressed when forming. Alternatively, a plate without having any first and second recesses 121 and 122 and any optically functional portion 111 may be prepared in advance and then processed, thereby preparing the light guide plate 10. Otherwise, a light guide plate provided with the first recesses 121, the second recesses 122, and the optically functional portion 111 may be prepared by purchase.

Figure 8B:
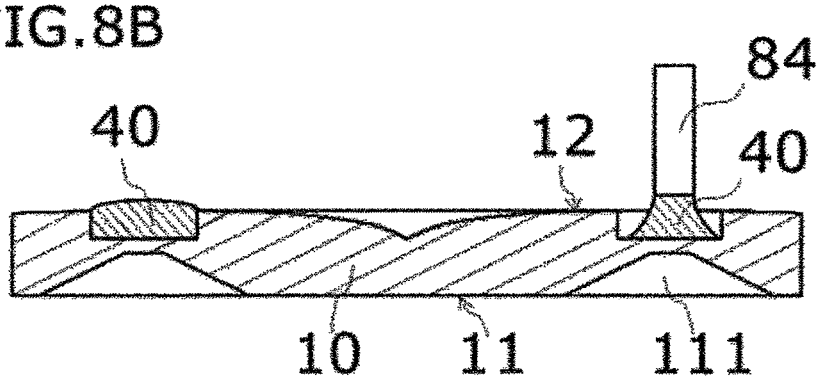
FIG. 8B is a partially enlarged schematic cross-sectional view showing an example of another manufacturing step of the light emitting module according to the first embodiment.

(3) Step of placing the light source member (light emitting device) on the bottom surface of each recess such that the side surface of the first recess at least faces the side surface of the light emitting element Then, as shown in FIG. 8B, the liquid joint member 40 is disposed on the bottom surface 121a of each of the first recesses 121. The joint member 40 may be applied by potting, transferring, printing, or the like. FIG. 8B exemplifies a case where the joint member 40 is disposed by potting using a dispensing nozzle 84. The joint member 40 may be previously provided on the light emitting device 30 side. For example, a method may be used which involves picking up the light emitting device 30 by an adsorption member, such as an adsorption collet, and immersing the light emitting surface of the light emitting device 30 in the liquid joint member 40 to attach the joint member 40 to the light emitting surface.

Figure 8C:
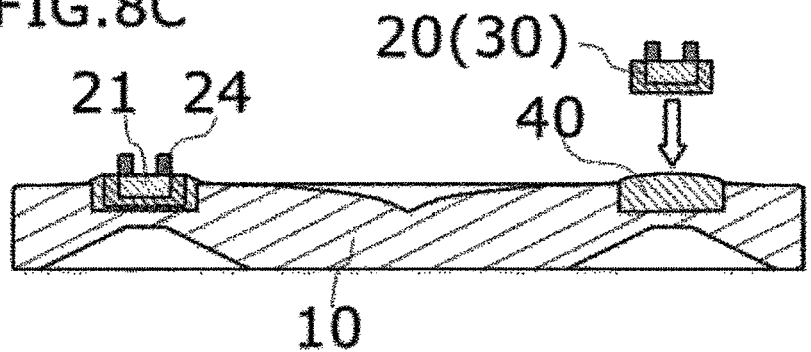
FIG. 8C is a partially enlarged schematic cross-sectional view showing an example of another manufacturing step of the light emitting module according to the first embodiment.

Then, as shown in FIG. 8C, each light emitting device 30 is placed on the joint member 40 inside the first recess 121. At this time, the light emitting device 30 is placed with the electrodes 24 facing upward. Concurrently, at least a part of the side surface of the light emitting element 21 in the light emitting device 30 faces the side surface of the first recess 121. That is, the light emitting device 30 is disposed on the joint member 40 in such a manner as to be partially embedded in the joint member 40. Thereafter, by curing the joint member 40, the light emitting device 30 and the light guide plate 10 are joined together.

Figure 8D:
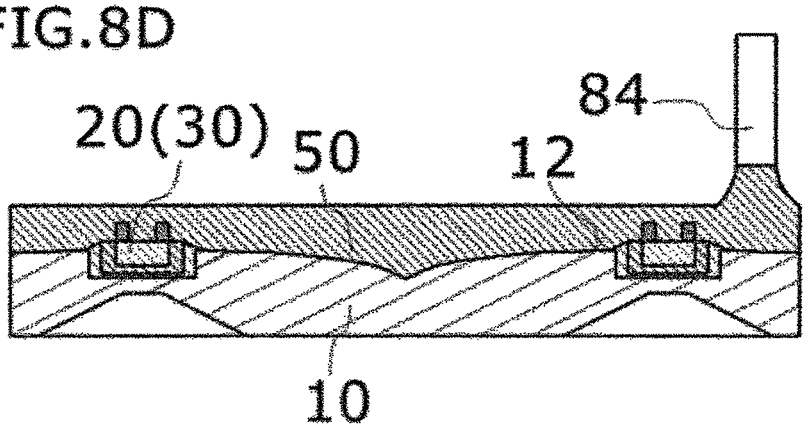
FIG. 8D is a partially enlarged schematic cross-sectional view showing an example of another manufacturing step of the light emitting module according to the first embodiment.

(4) Step of disposing the sealing member to cover the light source member and the second main surface Then, as shown in FIG. 8D, the sealing member 50 is formed to cover the second main surface 12 of the light guide plate 10 and the plurality of light emitting devices 30. The sealing member 50 may be formed, for example, by transfer molding, potting, printing, spraying, or the like. FIG. 8D shows an example in which the sealing member 50 is thickly formed to cover the electrodes 24 of the light emitting device 30 using the dispensing nozzle 84. The sealing member 50 may be formed not to embed the electrodes 24 therein, in other words, to expose at least a part of the electrodes 24.

(5) Step of removing the sealing member until the electrodes are exposed

Figure 8E:
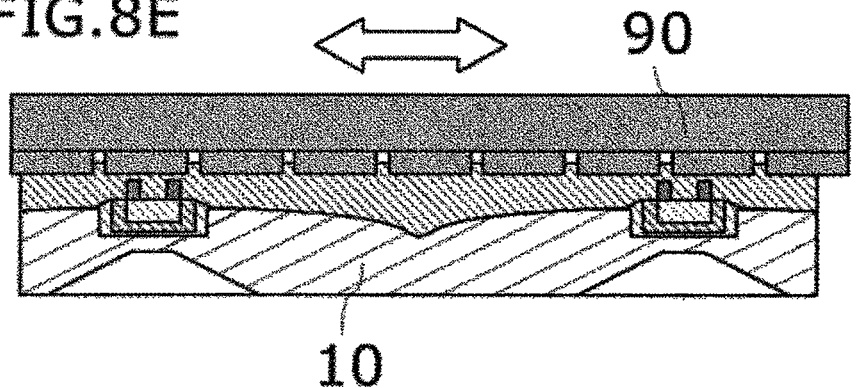
FIG. 8E is a partially enlarged schematic cross-sectional view showing an example of another manufacturing step of the light emitting module according to the first embodiment.
Figure 8F:
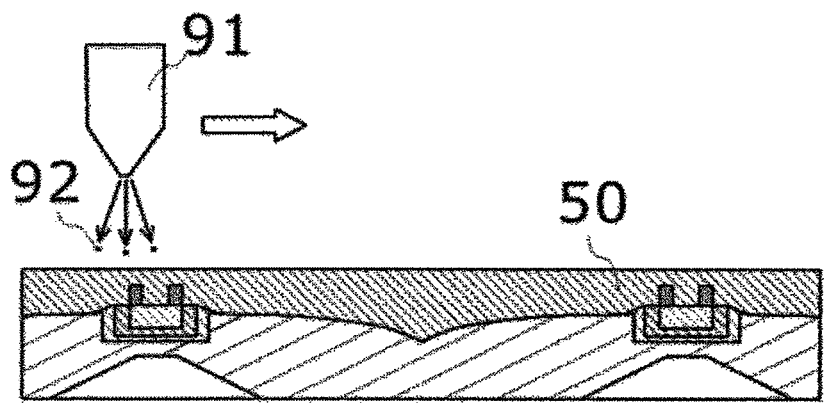
FIG. 8F is a partially enlarged schematic cross-sectional view showing an example of another manufacturing step of the light emitting module according to the first embodiment.
Figure 8G:
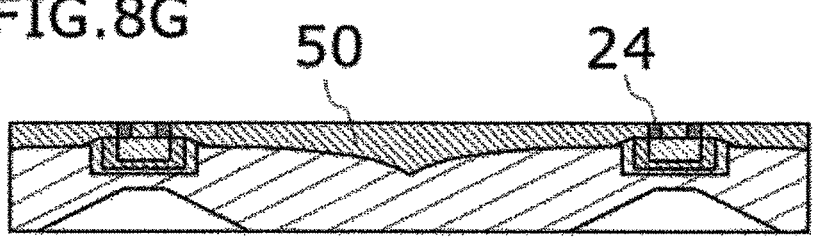
FIG. 8G is a partially enlarged schematic cross-sectional view showing an example of another manufacturing step of the light emitting module according to the first embodiment.

Then, as shown in FIG. 8E, the sealing member 50 is removed across its entire surface. Thus, as shown in FIG. 8G, the electrodes 24 of the light emitting device 30 are exposed from the sealing member 50. As a grinding method, a method of grinding the sealing member 50 into a planar shape using a grinding member 90, such as a grindstone, may be employed. Alternatively, as shown in the drawing 8F, a part of the sealing member 50 may be removed using hard particles 92 discharged from a blast nozzle 91.

In a case where the light emitting device 30 includes the first metal film 25 connected to the electrode 24, the sealing member 50 may be removed until the first metal film 25 is exposed. In either case, the sealing member 50 is removed until the conductor member capable of supplying power to the light emitting element 21 of the light source member 20 is exposed. Alternatively, in a case where the sealing member 50 is formed not to embed therein the electrodes 24 in advance, this step may be omitted.

Figure 8H:
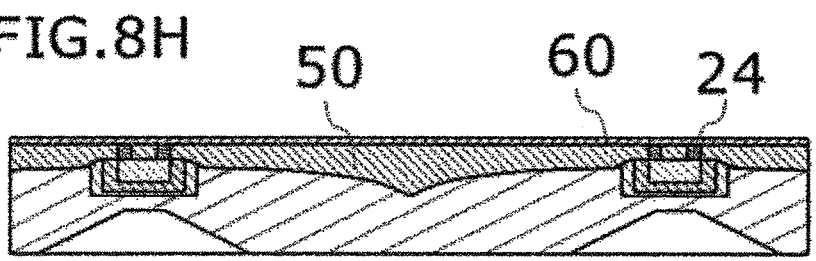
FIG. 8H is a partially enlarged schematic cross-sectional view showing an example of another manufacturing step of the light emitting module according to the first embodiment.

(6) Step of forming the metal film to be electrically connected to the plurality of light emitting elements Then, as shown in FIG. 8H, the second metal film 60 is formed over the substantially entire surfaces of the electrodes 24 of the light emitting devices 30 and the sealing member 50. The second metal film 60 may have a laminated structure formed by laminating, for example, Cu, Ni, and Au films (Cu/Ni/Au) in this order from the light guide plate 10 side. Examples of the formation method of the second metal film 60 include sputtering, plating, and the like. Especially, the second metal film 60 is preferably formed by the sputtering.

Figure 8I:
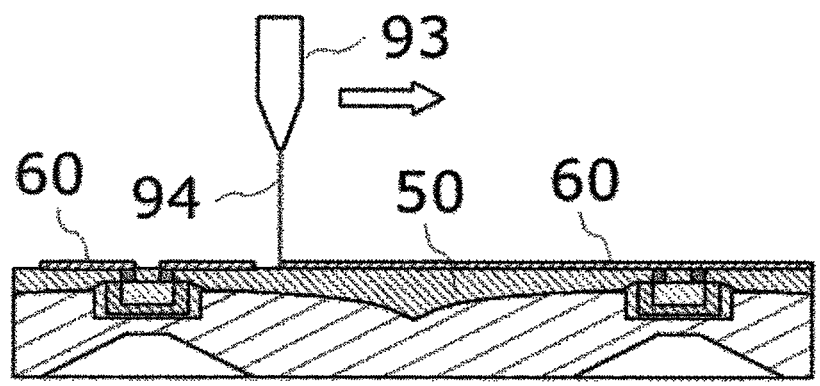
FIG. 8I is a partially enlarged schematic cross-sectional view showing an example of another manufacturing step of the light emitting module according to the first embodiment.
Figure 8J:
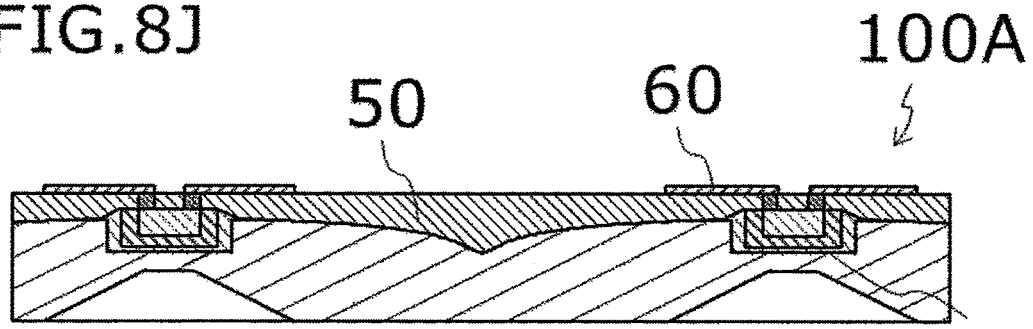
FIG. 8J is a partially enlarged schematic cross-sectional view showing an example of another manufacturing step of the light emitting module according to the first embodiment.

Then, as shown in FIG. 8I, portions of the second metal film 60 are irradiated with laser light 94 from a laser light source 93, whereby the irradiated portions of the second metal film 60 are removed. In this way, the second metal film 60 is patterned by laser ablation. Consequently, as shown in FIG. 8J, the separated second metal films 60 are formed. The second metal films 60 thus formed are electrically connected to the electrodes 24 of the light emitting devices 30.

In this way, the light emitting module 100A can be obtained. Furthermore, the second metal film 60 and the wirings 72 on the wiring board 70 prepared separately from the second metal film may be bonded together, thereby producing the light emitting module 100 that includes the wiring board 70 shown in FIG. 1B.

The plurality of light source members 20 may be wired to be independently driven. In addition, the light guide plate 10 may be divided into a plurality of divided regions, and a plurality of light emitting devices 30 mounted in one region is defined as one group. The plurality of light emitting devices 30 in one group may be electrically connected in series or parallel with each other and thereby connected to the same circuit. Thus, the light emitting module may include a plurality of such groups of the light emitting devices (light source members). By grouping the light emitting devices in this way, the light emitting module that enables local dimming is provided.

Second Embodiment

Figure 9B:
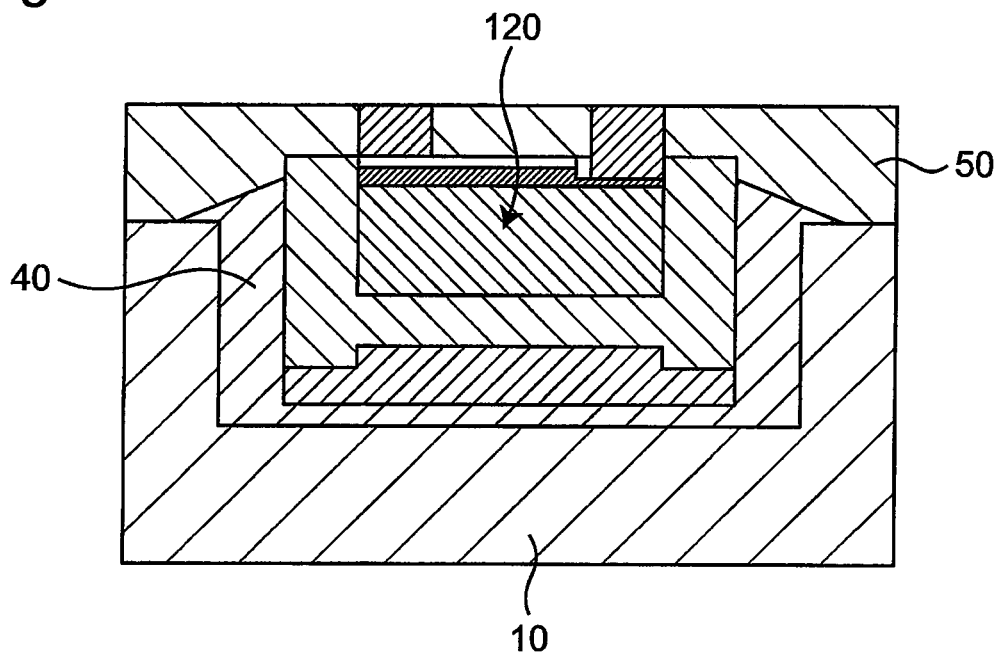
FIG. 9B is an enlarged schematic cross-sectional view showing a part of FIG. 9A.

Next, a light emitting module 100B of a second embodiment according to the present invention will be described with reference to FIGS. 9A to 9C. FIG. 9A is a cross-sectional view of the light emitting module 100B; FIG. 9B is an enlarged cross-sectional view showing one light source member and its surroundings shown in the cross-sectional view of FIG. 9A; and FIG. 9C is a cross-sectional view showing the configuration of a light source member 120.

Figure 9C:
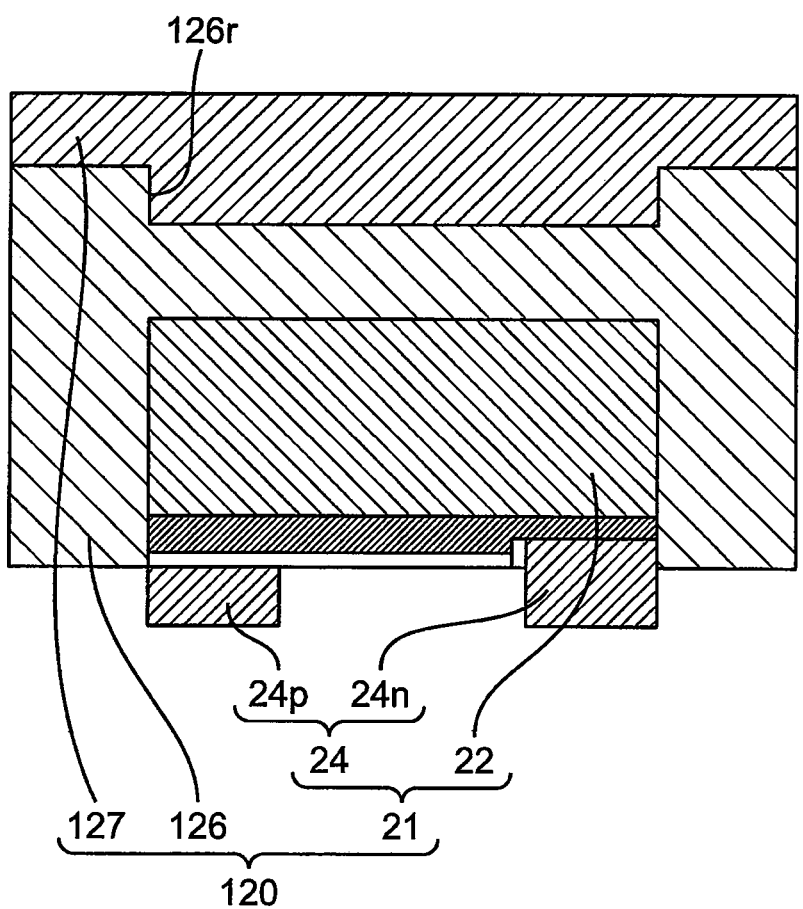
FIG. 9C is a schematic cross-sectional view showing an example of a light source member in the light emitting module according to the second embodiment.

As shown in FIGS. 9A to 9C, the light emitting module 100B of the second embodiment has the same configuration as that of the first embodiment except for the configuration of the light source member 120. Here, in FIGS. 9A to 9C, the same members as those described in the first embodiment are denoted by the same reference numerals, and a specific description of the same members will be omitted below.

Differences of the light emitting module 100B in the second embodiment from the first embodiment will be described below.

In the light emitting module 100B of the second embodiment, the light source member 120 has a light-diffusion light guide member 127 provided on an upper surface of a wavelength conversion member 126. The light-diffusion light guide member 127 is a light-transmissive member containing a light diffusion material. The light-diffusion light guide member 127 laterally diffuses and emits the light discharged from the upper surface of the wavelength conversion member 126.

In an example shown in FIG. 9C, a third recess 126r is formed in the upper surface of the wavelength conversion member 126, and the light-diffusion light guide member 127 is also provided inside the third recess 126r and on the upper surface of the wavelength conversion member 126 around the third recess 126r. Here, in the example shown in FIG. 9C, the upper surface of the wavelength conversion member 126 includes an inner surface of the third recess 126r and the upper surface of the wavelength conversion member 26 around the third recess 126r. In FIG. 9C and the like, the size of the third recess 126r is illustrated in the same size as the main light emitting surface 21a of the light emitting element 21, but the present invention is not limited thereto. The planar shape of the third recess 126r may be larger or smaller than the main light emitting surface 21a.

In the light emitting module 100B of the second embodiment, the light-diffusion light guide member 127 has the function of spreading light in the plane of the light guide plate 10 in the same manner as the optically functional portion 111 described in the first embodiment. The light-diffusion light guide member 127 is preferably provided such that the central axis of the light-diffusion light guide member 127 coincides with the central axis of the main light emitting surface of the light emitting element 21. Thus, the light can be uniformly spread in the plane of the light guide plate 10, or in other words, without being oriented along the specific direction in the plane.

The light-diffusion light guide member 127 preferably emits the light without absorbing the light emitted from the upper surface of the wavelength conversion member 126. The light-diffusion light guide member 127 transmits, for example, 60% or more and preferably 90% or more of the light emitted from the upper surface of the wavelength conversion member 126. The light-diffusion light guide member 127 is constituted of a light-transmissive member that contains a light diffusion material in order to have adequate translucency and light diffusion property mentioned above. The light-transmissive member is a base material composed of a light-transmissive material that transmits, for example, 60% or more and preferably 90% or more of the light emitted from the light emitting element 21 and having its wavelength converted by the wavelength conversion member 126. The light diffusion material reflects the above-mentioned light without absorbing it.

As the light-transmissive material constituting the light-transmissive member, a light-transmissive thermosetting resin material, such as an epoxy resin or a silicone resin, may be used. As the light diffusion material, fine particles of $SiO_2$, $TiO_2$, $Al_2O_3$, ZnO, or the like may be used.

In the light-diffusion light guide member 127, the proportion of the light diffusion material in the light-transmissive member is set as appropriate based on the properties required for the light emitting module 100B in consideration of the light reflectivity, particle size, and particle size distribution of the material used as the light diffusion material, the shape of the light guide plate 10, and the like.

The light emitting module 100B configured as mentioned above may uniformly spread the light emitted from the light emitting element 21 and having its wavelength converted by the wavelength conversion member 26, in the plane of the light guide plate 10 without using the optically functional portion.

Therefore, the light emitting module 100B of the second embodiment can emit the light with less unevenness of color and luminance, from the first main surface 11 of the light guide plate 10 without using the optically functional portion.

Since the light emitting module 100B of the second embodiment can uniformly emit and spread the light from the light source member 120 in the plane of the light guide plate 10, the light with less unevenness of color and luminance can be emitted from the first main surface 11 of the light guide plate 10 without using the optically functional portion, thereby providing a thinned surface-emitting light source.

In the light emitting module 100B of the second embodiment, an optical functional portion may be provided in the light guide plate 10, in addition to the light source member 120 including the light-diffusion light guide member 127.

The light emitting module 100B of the second embodiment mentioned above may be manufactured in the same method as the light emitting module 100A of the first embodiment except for the step of forming the light-diffusion light guide member 127 in the process of forming the light source member 120.

In the second embodiment, the light source member 120 is produced, for example, in the following way.

As shown in FIG. 6A, which is referred to in the first embodiment, a plurality of light emitting elements 21 are disposed on the support 80 with the pair of electrodes facing downward.

An uncured wavelength conversion member 126 is formed to embed the light emitting elements 21 therein.

Then, the third recesses 126r are formed using, for example, a mold in positions corresponding to the respective light emitting elements 21, on the upper surface of the uncured wavelength conversion member 126. The wavelength conversion member 126 is cured with the shape of each third recess 126r maintained.

Then, an uncured light-transmissive resin material that contains the light diffusion material is formed on an upper surface of the cured wavelength conversion member 126 so as to fill each of the third recesses 126r therewith.

Subsequently, by curing the light-transmissive resin material, a light-reflective light guide member layer is formed to be integrated with the upper portion of the wavelength conversion member 126.

Then, the wavelength conversion member 26 is cut with the cutting blade 82, such as a dicer, as described with reference to FIG. 6C. In the way described above, the light source member 120 may be obtained.

Modification 1 of Second Embodiment

Figure 10A:
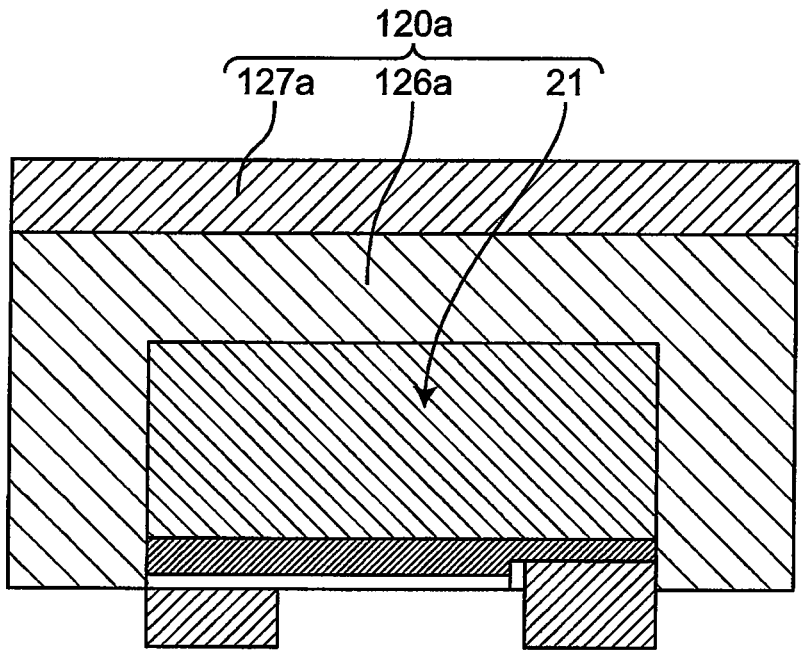
FIG. 10A is a schematic cross-sectional view of a light source member in modification 1 of the light emitting module according to the second embodiment.

The light emitting module 100B of the second embodiment has been described as an example of using the light source member 120 shown in FIG. 9C. However, the light emitting module 100B of the second embodiment may be configured using a light source member 120a shown in FIG. 10A. The light source member 120a shown in FIG. 10A includes a wavelength conversion member 126a that does not include the third recess 126r, instead of the wavelength conversion member 126 including the third recess 126r shown in FIG. 9C. The light source member 120a shown in FIG. 10A differs from the light source member 120 shown in FIG. 9C in that the light-diffusion light guide member 127a with the substantially certain thickness is provided on a flat upper surface of the wavelength conversion member 126a.

The light emitting module 100B of the second embodiment may also be configured using the light source member 120a configured as mentioned above.

Modification 2 of Second Embodiment

Figure 10B:
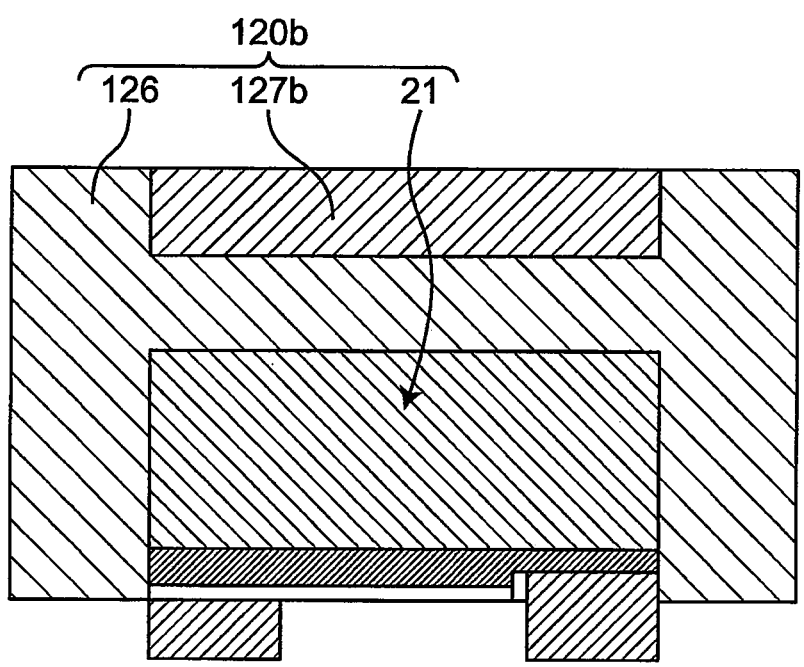
FIG. 10B is a schematic cross-sectional view of a light source member in modification 2 of the light emitting module according to the second embodiment.

The light emitting module 100B of the second embodiment has been described as an example of using the light source member 120 shown in FIG. 9C. However, the light emitting module 100B of the second embodiment may be configured using a light source member 120b shown in FIG. 10B. The light source member 120b shown in FIG. 10B is the same as the light source member 120 shown in FIG. 9C in that it has the wavelength conversion member 126 with the third recesses 126r shown in FIG. 9C. However, the light source member 120b shown in FIG. 10B differs from the light source member 120 shown in FIG. 9C in that the light-diffusion light guide member 127b is provided only inside the third recess 126r.

The light emitting module 100B of the second embodiment may also be configured using the light source member 120b configured as mentioned above.

As mentioned in the modifications 1 and 2 above, the light-diffusion light guide member in the light source member may be configured in various forms on the upper surface of the wavelength conversion member. For example, the third recess may be formed in a cone or frustum shape other than the shapes exemplified in FIGS. 9C, 10A, and 10B, and the light-diffusion light guide member may be formed only inside the third recess or to extend from the inside of the third recess toward its periphery. Alternatively, the third recess may have a polygonal pyramid shape, such as a quadrangular pyramid or a hexagonal pyramid.

Modification 3 of Second Embodiment

Figure 11A:
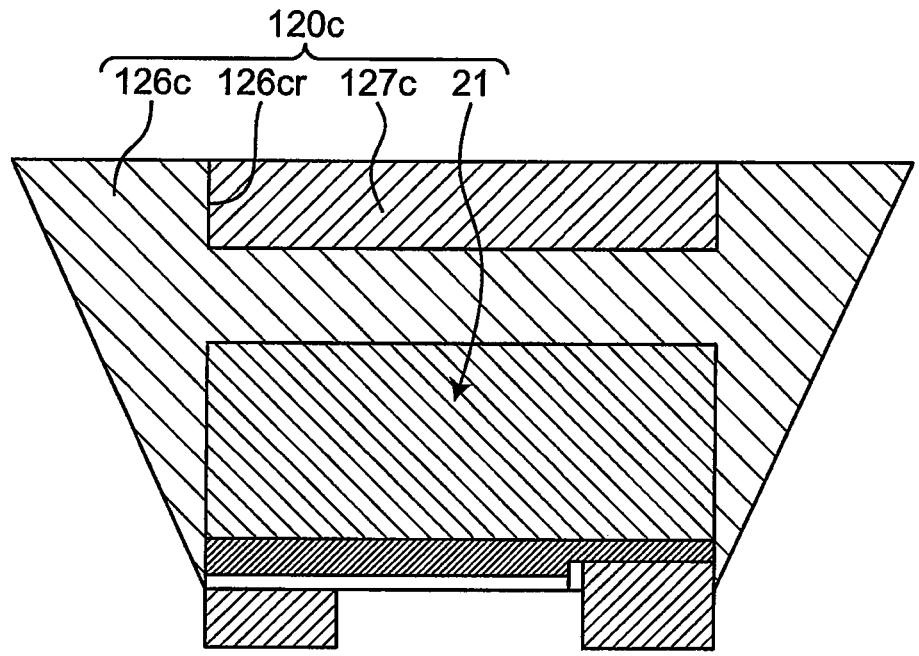
FIG. 11A is a schematic cross-sectional view of a light source member in modification 3 of the light emitting module according to the second embodiment.

The light emitting module 100B of the second embodiment may be configured using a light source member 120c shown in FIG. 11A. The light source member 120c shown in FIG. 11A differs from the light source member 120b shown in FIG. 10B in that the side surface of a wavelength conversion member 126c is inclined. The light source member 120c is the same as the light source member 120b shown in FIG. 10B except that the side surface of the wavelength conversion member 126c is inclined.

More specifically, the wavelength conversion member 126c covering the side surfaces of the light emitting element 21 has a thickness of substantially zero near the electrode formation surface of the light emitting element 21, so that the thickness of the light emitting element 21 gradually increases from the electrode formation surface thereof toward the main light emitting surface 21a.

Figure 11B:
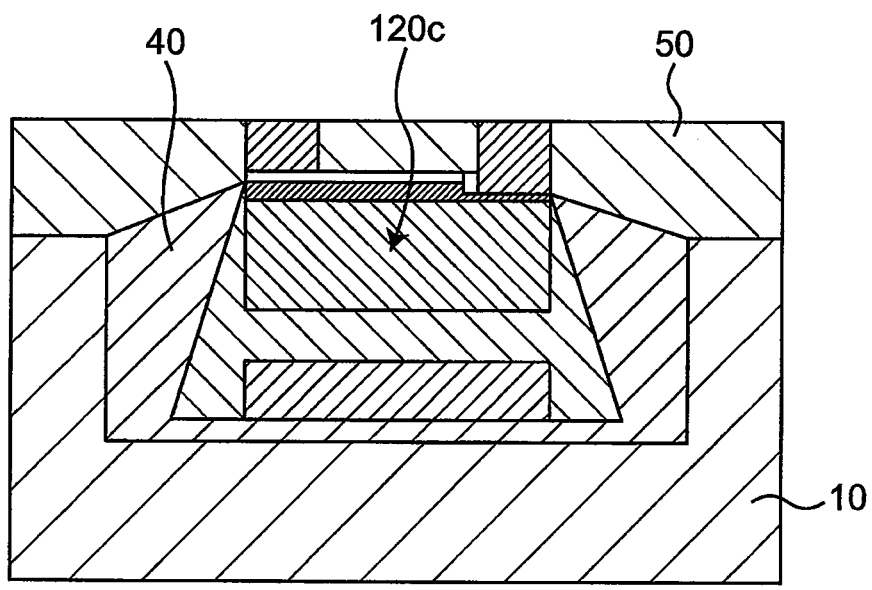
FIG. 11B is a partially enlarged schematic cross-sectional view of the emitting module when using the light source member of the modification 3 of the light emitting module according to the second embodiment.

FIG. 11B is an enlarged cross-sectional view showing a part of the cross-section of a light emitting module on which the light source member 120c shown in FIG. 11A is mounted.

In the light emitting module that includes the light source member 120c of the modification 3 configured as described above, since the side surfaces of the wavelength conversion member 126c are inclined in the light source member 120c, the area of the side surface of the light source member 120c may be made larger than that in the case where the side surfaces of the wavelength conversion member are not inclined. Thus, the amount of light emitted to the light guide plate 10 can be increased, thereby enhancing the luminance of the light emitting module.

One light emitting module 100, 100A, or 100B of the present embodiment may be used as a backlight of one liquid crystal display device. Further, the plurality of light emitting modules 100 may be arranged side by side and used as the backlight of one liquid crystal display device.

One light emitting module 100 may be joined to one wiring board 70. Alternatively, a plurality of light emitting modules 100 may be joined to one wiring board 70. This can consolidate connection terminals (for example, connectors) used for electric connection with an external unit, into one connection terminal (that is, the connection terminal does not need to be prepared for each light emitting module). Thus, the structure of the liquid crystal display device can be simplified.

A plurality of wiring boards 70, each having the plurality of light emitting modules 100 joined together thereon, may be arranged side by side to make a backlight of one liquid crystal display device. At this time, for example, the plurality of wiring boards 70 are placed on a frame or the like and may be respectively connected to an external power source by connectors or the like.

The light emitting device according to the present disclosure may be used as, for example, a backlight of a liquid crystal display device.

What is claimed is:

1. A light emitting module comprising:
a light guide plate having a first main surface and a second main surface opposite to the first main surface;
a plurality of light source members disposed on a second main surface side, each of the plurality of light source members comprising
a light emitting element that has a main light emitting surface, an electrode formation surface located opposite to the main light emitting surface, and a side surface between the main light emitting surface and the electrode formation surface, and
a wavelength conversion member directly covering the main light emitting surface and the side surface of the light emitting element;
a joint member joining the wavelength conversion member and the light guide plate; and
a sealing member covering the plurality of light source members and the second main surface of the light guide plate,
wherein the light guide plate has a plurality of first recesses located at the second main surface, and each of the plurality of light source members is disposed such that at least a part of the side surface of the light emitting element is located in the corresponding first recess in a cross-sectional view, and
wherein the joint member is disposed between a bottom surface of the first recess and the wavelength conversion member and also between a side surface of the first recess and the wavelength conversion member, and
wherein the joint member is further disposed so as to cover a part of the second main surface of the light guide plate.

2. The light emitting module according to claim 1, wherein the light guide plate has a plurality of second recesses, each of the plurality of second recesses surrounding one of the plurality of first recesses, and wherein a low refractive index member that has a refractive index lower than a refractive index of the light guide plate is disposed in each of the plurality of second recesses.

3. The light emitting module according to claim 1, wherein the light guide plate has a second recess provided so as to divide the second main surface of the light guide plate into a plurality of divided regions, wherein each of the plurality of first recesses is provided in each of the plurality of divided regions, and wherein the sealing member is disposed in the second recess.

4. The light emitting module according to claim 1, wherein the light guide plate has a plurality of optically functional portions on the first main surface side, each of the plurality of optically functional portions being provided at a position corresponding to each of the plurality of first recesses.

5. The light emitting module according to claim 4, wherein each of the plurality of optically functional portions has a first reflective member.

6. The light emitting module according to claim 4, wherein each of the plurality of optically functional portions is a conical or frustum-shaped recess formed so that an area of a cross section decreases toward the light emitting surface of the light emitting element.

7. The light emitting module according to claim 1, wherein the light source member has a light-diffusion light guide member provided on an upper surface of the wavelength conversion member.

8. The light emitting module according to claim 7, wherein the light-diffusion light guide member contains a light diffusion material.

9. The light emitting module according to claim 1, wherein the light source member has a second reflective member that covers the electrode formation surface of the light emitting element.

10. The light emitting module according to claim 1, wherein a planar shape of the bottom surface of the first recess is the same as a planar shape of an opening of the first recess.

11. The light emitting module according to claim 1, wherein the light emitting element comprises electrodes formed on the electrode formation surface of the light emitting element, wherein the light emitting module further comprises a second metal layer electrically connected to the electrodes, wherein the sealing member further covers the electrodes formed on the electrode formation surface of the light emitting element, and wherein the second metal layer electrically connected to the electrodes is disposed over the sealing member.

12. The light emitting module according to claim 1, wherein the joint member extends along a side surface of the wavelength conversion member in a cross-sectional view.

13. A light emitting module comprising:
a light guide plate having a first main surface and a second main surface opposite to the first main surface;
a plurality of light source members disposed on a second main surface side, each of the plurality of light source members comprising
a light emitting element that has a main light emitting surface, an electrode formation surface located opposite to the main light emitting surface, and a side surface between the main light emitting surface and the electrode formation surface, and comprises electrodes formed on the electrode formation surface of the light emitting element, and a wavelength conversion member covering the main light emitting surface and the side surface of the light emitting element;

a sealing member covering the plurality of light source members and the second main surface of the light guide plate; and a joint member joining the wavelength conversion member and the light guide plate;

a second metal layer electrically connected to the electrodes and disposed over the sealing member, wherein the light guide plate has a plurality of first recesses located at the second main surface, and each of the plurality of light source members is disposed such that at least a part of the side surface of the light emitting element is located in the corresponding first recess in a cross-sectional view, wherein the sealing member further covers electrodes formed on the electrode formation surface of the light emitting element and the wavelength conversion member, wherein the joint member is disposed between a bottom surface of the first recess and the wavelength conversion member and also between a side surface of the first recess and the wavelength conversion member, and wherein the joint member is further disposed so as to cover a part of the second main surface of the light guide plate.

* * * * *